United States Patent
Mitsuhashi

(10) Patent No.: US 8,364,452 B2
(45) Date of Patent: Jan. 29, 2013

(54) METHOD AND SYSTEM FOR LITHOGRAPHY SIMULATION AND MEASUREMENT OF CRITICAL DIMENSIONS WITH IMPROVED CD MARKER GENERATION AND PLACEMENT

(75) Inventor: Takashi Mitsuhashi, Fujisawa (JP)

(73) Assignee: Cadence Design Systems, Inc., San Jose, CA (US)

( * ) Notice: Subject to any disclaimer, the term of this patent is extended or adjusted under 35 U.S.C. 154(b) by 777 days.

(21) Appl. No.: 11/678,530

(22) Filed: Feb. 23, 2007

(65) Prior Publication Data

US 2008/0118852 A1    May 22, 2008

Related U.S. Application Data

(63) Continuation-in-part of application No. 11/603,526, filed on Nov. 21, 2006, now Pat. No. 7,953,582.

(51) Int. Cl.
G06G 7/48    (2006.01)
(52) U.S. Cl. .............................. 703/6; 716/50
(58) Field of Classification Search .......... 703/6; 716/4, 716/5, 19, 20, 50, 51, 52; 430/30
See application file for complete search history.

(56) References Cited

U.S. PATENT DOCUMENTS

| | | | |
|---|---|---|---|
| 4,442,188 A | 4/1984 | Chiang | |
| 5,424,173 A | 6/1995 | Wakabayashi et al. | |
| 5,952,135 A | 9/1999 | Ghandehari et al. | |
| 6,175,417 B1 | 1/2001 | Do et al. | |
| 6,701,474 B2 | 3/2004 | Cooke et al. | |
| 6,760,640 B2 | 7/2004 | Suttile et al. | |
| 7,013,439 B2 | 3/2006 | Robles et al. | |
| 7,018,746 B2 | 3/2006 | Cui et al. | |
| 2002/0100004 A1* | 7/2002 | Pierrat et al. | 716/5 |
| 2004/0228515 A1 | 11/2004 | Okabe et al. | |

OTHER PUBLICATIONS

C. Sengupta, J. R. Cavallaro, W. L. Wilson, Jr., and F. K. Tittel, "Automated evaluation of critical features in VLSI layouts based on photolithographic simulations," IEEE Trans. Semiconduct. Manufact., vol. 10, pp. 482-494, Nov. 1997.*
Lapanik et al.U.S. Appl. No. 11/607,753, filed Nov. 11, 2006.
Fujimura, A. et al. U.S. Appl. No. 11/603,603, filed Nov. 21, 2006.
Yoshida, K., U.S. Appl. No. 11/603,441, filed Nov. 21, 2006.
Yoshida et al. U.S. Appl. No. 11/607,305, filed Dec. 1, 2006.
Fujimura et al. U.S. Appl. No. 11/677,973, filed Feb. 2, 2007.
Hara et al. U.S. Appl. No. 11/603,527, filed Nov. 11, 2006.
Hara et al. U.S. Appl. No. 11/603,526, filed Nov. 11, 2006.
Mitsuhashi,T. U.S. Appl. No. 11/226,253, filed Sep. 15, 2005.
Peters, Laura, "DFM: Worlds Collide Then Cooperate," Semiconductor International, Jun. 2005, Retrieve from the Internet. <URL: http://ww.synopsys.com/products/tcar/pds/semi_int_june05.pdf>.
Inanami, et al. "Throughput Enhancement Strategy of Maskless Electron Beam Direct Writing for Logic Device", Process & Manufacturing Engineering Center, Semiconductor Company, Toshiba Corp. pp. 833-836, 2000.
Hara, et al. "Character Projection EB Data Conversion System Combined with Throughput Analyzer", Jpn J. Appl. Phys. vol. 33, Oct. 1994, pp. 6935-6939.

(Continued)

*Primary Examiner* — Kandasamy Thangavelu
*Assistant Examiner* — Luke Osborne
(74) *Attorney, Agent, or Firm* — Vista IP Law Group, LLP

(57) ABSTRACT

A method and system for lithography simulation and measurement of critical dimensions with improved CD marker generation and placement is disclosed. The method and system specify a position for measuring a difference between a lithography image and a target pattern, generate one or more CD marker candidates, and select at least one CD marker from the one or more CD marker candidates.

42 Claims, 17 Drawing Sheets

OTHER PUBLICATIONS

Hattori, et al. "Electron-beam direct writing system EX-8D employing character projection exposure method", J. Vac. Sci. Technol. B 11(6) Nov./Dec. 1993, pp. 2346-2351.

Nakasugi, et al. "Maskless lithography using low-energy electron beam: Recent results for proof-of-concept system", J. Vac. Sci. Technol. B 20(6), Nov./Dec. 2002, pp. 2651-2656.

International Search Report and Written Opinion dated Aug. 11, 2008 for PCT/US2007/85090.

Non-Final Office Action mailed Feb. 3, 2010 for U.S. Appl. No. 11/603,526.

Depesa et al., "Automated critical dimension and registration communication" Proc. SPIE vol. 1604, (one page—abstract), 11th Annual BACUS Symposium on Photomask Technology, Kevin C. McGinnis; Ed., 1992.

C. Sengupta, J.R. Cavallaro, W.L Wilson, Jr., and F.K. Tittel, "Automated evaluation of critical features in VLSI layouts based on photolithographic simulations," IEEE Trans. Semiconduct. Maufact., vol. 10, pp. 482-494, Nov. 1997.

Advisory Action dated Apr. 13, 2010 for related U.S. Appl. No. 11/603,526, filed Nov. 21, 2006, Inventor: Daisuke Hara, (14 pages).

Notice of Allowance dated Oct. 5, 2010 for related U.S. Appl. No. 11/603,526, filed Nov. 21, 2006, Inventor: Daisuke Hara, (3 pages).

Notice of Allowance dated Jan. 20, 2011 for U.S. Appl. No. 11/603,526.

Notice of Allowance dated Oct. 5, 2010 for U.S. Appl. No. 11/603,526.

Advisory Action dated Apr. 13, 2010 for U.S. Appl. No. 11/603,526.

Final Office Action dated Feb. 3, 2010 for U.S. Appl. No. 11/603,526.

* cited by examiner

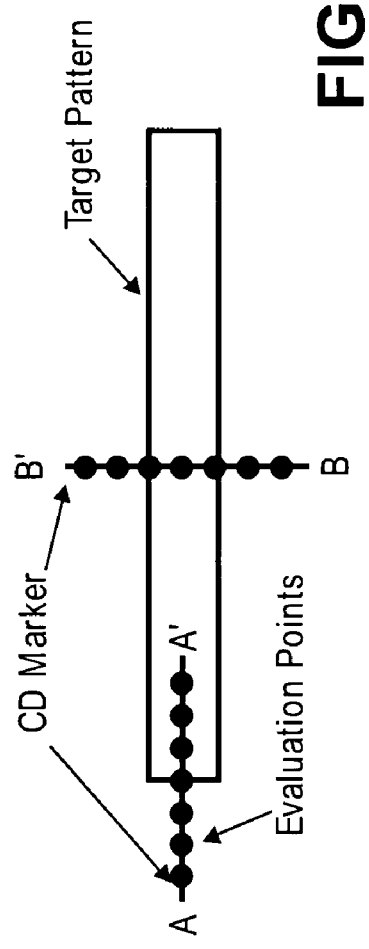
FIG. 4
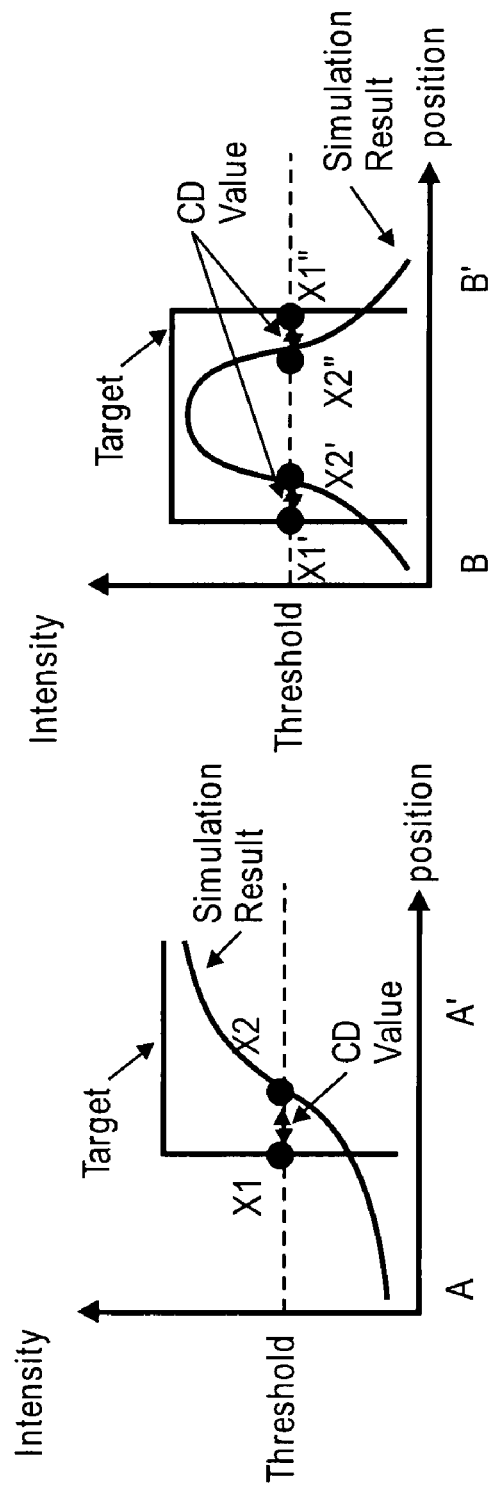
FIG. 5A
FIG. 5B

Critical Path Patterns in Layout

Critical Path Information

| Category | Dimension (D) | Condition | |
|---|---|---|---|
| | | Minimum (nm) | Maximum (nm) |
| P1 (Gate Length) | Gate Length | 70 | 120 |
| P2 (Endcap) | Endcap Length | - | 180 |
| P3 (Gate Position) | Gate Length | 70 | 120 |
| P4 (Inner Corner) | Distance from Diffusion | - | 220 |
| P5 (Outer Corner) | Distance from Contact | - | 100 |

Dimensional Conditions

METHOD AND SYSTEM FOR LITHOGRAPHY SIMULATION AND MEASUREMENT OF CRITICAL DIMENSIONS WITH IMPROVED CD MARKER GENERATION AND PLACEMENT

RELATED APPLICATIONS

This application is a continuation-in-part of U.S. patent application Ser. No. 11/603,526, now U.S. Pat. No. 7,953,582, filed Nov. 21, 2006, entitled "METHOD AND SYSTEM FOR LITHOGRAPHY SIMULATION AND MEASUREMENT OF CRITICAL DIMENSIONS", which is hereby incorporated by reference in its entirety.

BACKGROUND

1. Field

The field of the present invention relates to lithograph technology for fine image fabrication, and in particular to a lithography simulation system and measurement of critical dimensions with improved CD marker generation and placement.

2. Description of Related Art

Fine image fabrication by lithography uses technologies like particle beam writers for writing fine images on a plate coated by a particle beam sensitive resist and an optical projection lithography method that uses a mask having transparent and opaque parts on the surface of the mask for generating a fine image on a plate coated by a photo sensitive resist. An example of particle beam writers is an electron beam writer that is used for writing fine images on both silicon wafers and masks for optical projection lithography. A technology that uses electron beam writers for making fine images for semiconductor integrated circuits directly on the semiconductor wafer is called Electron Beam Direct Writing (EBDW) technology. EBDW technology is suitable for integrated circuit fabrication that may require a quick turn around time.

A fundamental problem with conventional lithograph technologies is image quality degradation and resolution limits caused by chemical and physical effects in the process of the technologies. An example of such phenomena is proximity effect, which occurs in both electron beam writing and optical projection lithography and causes differences between intended patterns and images obtained by the lithography technologies. This degradation of the image quality becomes serious when the image is finer. An accurate measurement of the image quality degradation or measuring differences between intended patterns and images distorted by the proximity effects are important for accurate correction of the effects.

Measurement of critical dimension (CD) of the image at a predefined point is important and called CD measurements. With reference to semiconductor integrated circuits, as an example, CD measurement is conventionally done by Critical Dimension Scanning Electron Microscope (CD-SEM) after fabricating the image by the lithography. In one aspect, CD measurement results may be required before fabrication of the image.

To resolve the above mentioned issues related to conventional CD measurement, simulators for analyzing proximity effect have been developed. Using these type of simulators, the degree of image quality degradation or differences between intended patterns and images obtained by the lithography technologies becomes predictable without fabrication. This simulation method still has a problem, wherein these simulators consume huge amounts of computing time for obtaining the lithography image for large area similar to a whole LSI chip. Specifying the CD measurement points is also tedious and time consuming work when the objective area becomes large. Even if CD measurement results are obtained, the amount of data is huge, and it is difficult to understand the result intuitively.

Another issue related to the lithography technology for fine image fabrication is that the obtained image becomes sensitive to the lithography process parameters with progress of image miniaturization. The sensitiveness is referred to as lithography process sensitivity hereafter. The lithography process sensitivity depends on a position of the image and environment of the image. Although knowing lithography process sensitivity at specified points of the image contributes to lithograph technology, no quick method is reported to calculate the lithography process sensitivity.

The conventional CD measurement equipment usage method, such as CD-SEM, as an example, is not efficient. The measurement points are conventionally specified by human engineers, wherein the selected points might not be optimal in the sense of efficient use of measurement equipment. Selecting many measurement points is also difficult for engineers.

In light of the foregoing discussion, a method and system that improves the speed of lithograph simulation and simultaneously improves the efficiency and accuracy of the CD measurement of the image by lithograph technologies is needed. The system should be capable of displaying huge amounts of data obtained by the CD measurement effectively and intuitively. In one aspect, sharing of CD measurement related data between the simulation and the equipment may be required for the system to improve efficiency and accuracy of the CD measurement. Although the conventional CD measurement methods focus on visible dimensions of the image, finding potential risk points of the image is essential with reference to the high lithography process sensitivity region. The CD measurement method that uses the lithography simulation should support such requirements.

SUMMARY

In the semiconductor manufacturing industry, lithography technology enables printing of accurate and fine patterns on wafers or masks. Electron Beam Direct Writing (EBDW) method allows writing patterns on a wafer by electron beam, and optical lithography (OL) methods enable printing images by predefined masks. Differences between intended patterns and an obtained printed image are observed in both EBDW and OL cases, which are caused by chemical or physical processes like proximity effect.

Computer simulation is an efficient means to investigate differences between intended patterns and obtained images. CD (Critical Dimension) measurements that measure critical dimensions of the image based on the computer simulation results are important and helpful. CD measurement results in conjunction with quality control of semiconductor manufacturing process can contribute yield improvement and efficient quality control.

In some embodiments, to achieve the above mentioned objectives, the concepts listed below contribute to improvement of quality and accuracy of lithography technology: (1) a method and equipment for fast lithography simulation and CD measurement, (2) an effective method for specifying measurement points that are critical and to be checked with attention, (3) a display method and equipment that is intuitively understandable, (4) a data processing system and method that transfer information based on CD measurement results by simulation for controlling, guiding inspection point finding, and helping inspection equipments, and (5) a method and system for calculating sensitivity of process variation to lithography image.

In one embodiment, a calculation method enables calculation of simulation based CD measurement results with small computing time by using CD markers for reducing computational efforts is presented.

In one embodiment, a CD marker setting method uses design hierarchies for reducing tedious manual CD marker setting operations. The design hierarchy includes library cells and blocks that are repeatedly used in the design.

In one embodiment, a lithography process sensitivity concept enables indication of potentially critical parts of lithography images and a fast calculation method of the lithography process sensitivity. The method uses CD marker for limiting calculation area for reducing computational time.

In one embodiment, a CD measurement result display method and equipment for helping intuitive understanding of distribution of CD measurement results is disclosed. The resultant values are associated with geometrical display of the lithography images.

In one embodiment, an intuitive and efficient method specifies a region for calculating partial statistical quantities. The method allows specifying the region from a display device showing images related to the layout.

In one embodiment, a method improves efficiency and accuracy of dimensional inspections and measurement of products like wafers and masks. The method forwards information generated from CD measurement simulation results and CD Markers to the equipment.

In one embodiment, a method for lithography simulation and measurement of critical dimensions with improved CD marker generation and placement includes specifying a position for measuring a difference between a lithography image and a target pattern, generating one or more CD marker candidates, and selecting at least one CD marker from the one or more CD marker candidates.

These and other objects and advantages of the present teachings will become more fully apparent from the following description taken in conjunction with the accompanying drawings.

BRIEF DESCRIPTION OF DRAWINGS

FIG. 4 shows CD Marker and Evaluation points.

FIGS. 5A-5B show embodiments of a CD Measurement method.

DETAILED DESCRIPTION

Figure 1:
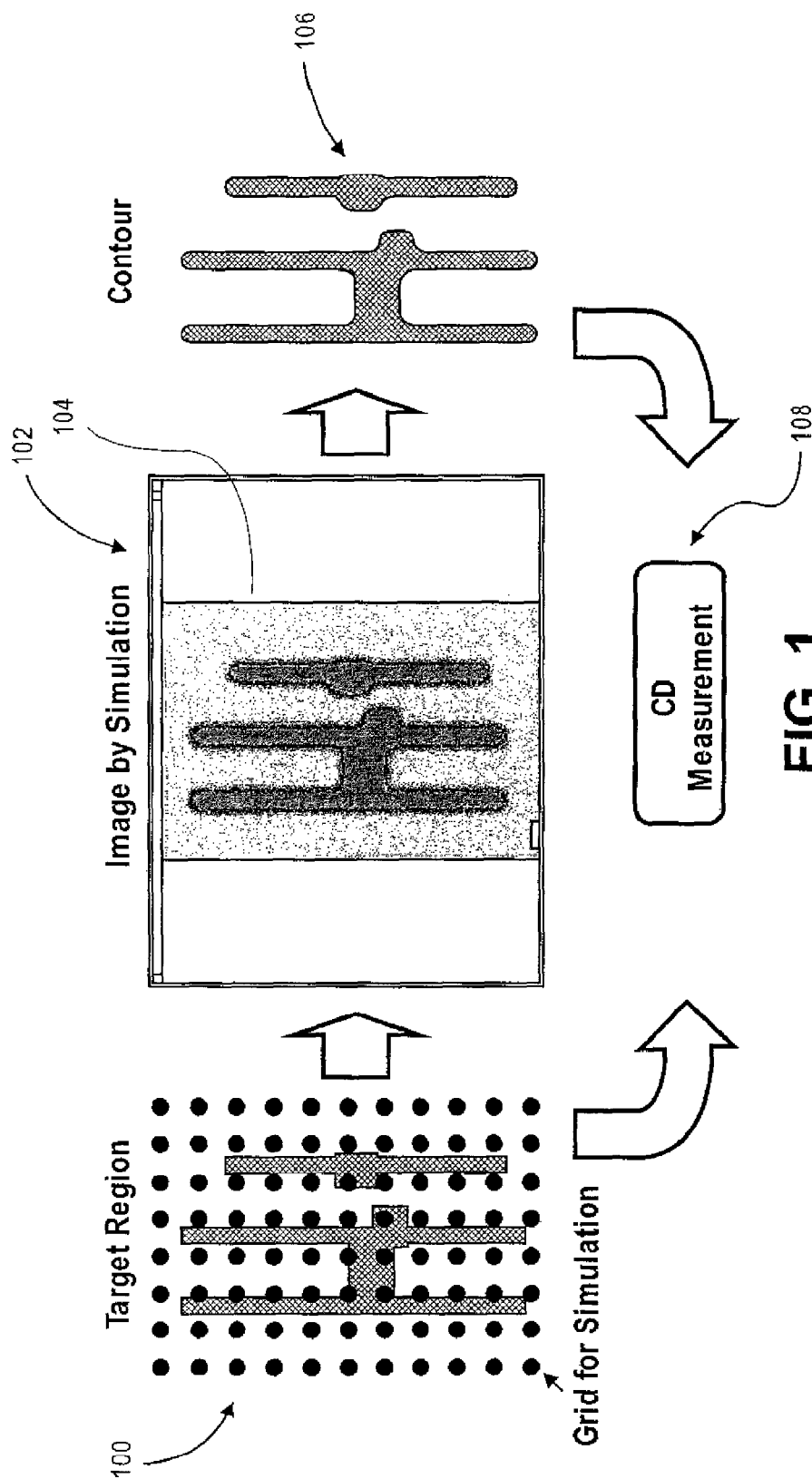
FIG. 1 shows conventional lithography simulation and procedure of CD measurement by the simulation.

Various embodiments of the invention are described hereinafter with reference to the drawings. It should be noted that the drawings are not drawn to scale and that elements of similar structures or functions are represented by like reference numerals throughout the drawings.

FIG. 1 shows conventional lithography simulation and procedure of CD measurement by the simulation. A target region 100 is an area where lithography simulation is performed. A grid 102 for simulation is a set of points that covers the target region 100 and intensity of the lithography is calculated at the points. An image 104 of the lithography obtained by the simulation, and contour 106 of the intensity.

Lithography is an indispensable technology for modern fine manufacturing. In the semiconductor industry, for example, it is relatively difficult to build a semiconductor manufacture process without lithography technologies. Other examples include fabrication of MEMS (Micro Electro-Mechanical System) and other micro-fabrications.

Although lithography is a strong technology for micro fabrication, it is not perfect. One of the issues is the proximity effect that degrades images obtained by the technology. The proximity effect is caused by influences of images placed near by, and changes the shape of the images. The proximity effect is caused by chemical and physical lithography process and occurs in both optical lithography and a lithography that uses a charged particle beam like an electron beam. More precisely speaking, the effect is caused by scattering of particles like electrons and photons that penetrate into resist and collide with molecules in resist and underlying materials.

To know the proximity effect by simulation is important for understanding how the degrading of the image occurs and for knowing the most effective way of the proximity effect correction. Hereafter, this simulation is called lithography simulation.

Conventionally several proximity or lithography simulators have been developed. However, it is not reported that those simulators can provide good quality images for sufficient area in a semiconductor application, such as, for example, a full chip region. Several studies on lithography simulation have been reported for accomplishing high speed calculation. In one aspect, these examples of devices include an acceleration of convolution calculation that may be required in lithography simulation by FFT (Fast Fourier Transform), reduction of computational amount by using irregular evaluation point mesh that is dense for steep intensity changing region and is coarse for gradually intensity changing region, and so on. However, those devices are not satisfactory for users who need lithography image for a large domain.

In one aspect, the purpose of obtaining the image by a lithography simulator is considered. FIG. 1 shows an example of practical use of conventional lithography simulation results. Intensity of the lithography that may be a quantity required to know, deposit energy for an example, is calculated for each point of a grid that covers a target region 100. The calculated results of the intensity can be seen as shown by "Image by Simulation" 104 in FIG. 1. Moreover, it may be required to know how the latent image is developed and seen on the resist. For such cases, a contour tracking program can be used to draw contours 106 that show development threshold of the resist. Measuring quantitative difference between image by lithography and the intended pattern at critical point of the pattern is important for understanding accuracy of the lithography. This is called CD (Critical Dimension) Measurement 108 and is commonly used for quality control of the wafer and mask fabrication. From quality control point of view, CD measurement 108 is more important than viewing images by the lithography.

Figure 2A:
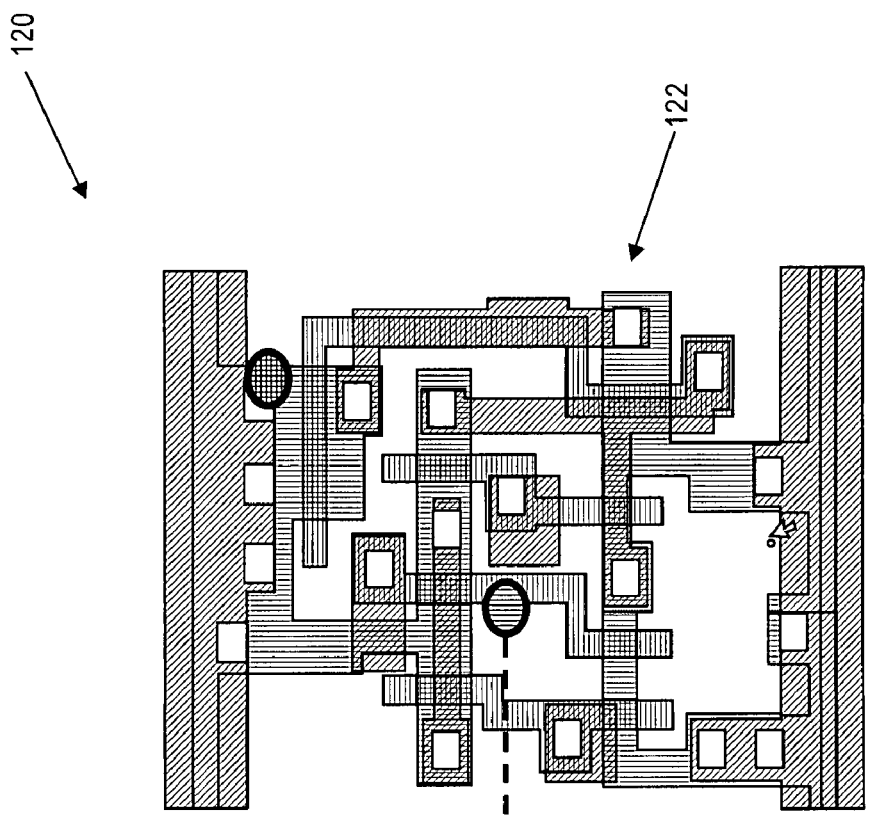
FIG. 2A shows one embodiment of CD Measurement and IC Layout.

Detail of the CD measurement 108 will be described with reference to semiconductor integrated circuits, as an example. FIG. 2A shows one embodiment of CD measurement 120 with an example of a logic cell layout 122, such as an integrated circuit (IC) layout, and FIG. 2B shows a part 124 of the logic cell layout with P1~P5 indicating CD markers.

FIG. 2A depicts an example of a layout for semiconductor integrated circuits (ICs) and a concept of CD measurement. FIG. 2B shows a part of the integrated circuit (IC) layout 122 and a pattern 124 for poly-silicon layer that is, for example, a gate of an MOS transistor. P1 through P5 of FIG. 2B show examples of CD measurement categories. In one embodiment, the meaning of each symbol is; for example, P1—gate length, P2—end cap or gate fringe, P3—gate position, P4—inner corner, P5—outer corner, respectively.

In the lithography process by the particle beam writing, many physical and chemical effects give influence on images obtained on the resist. Such effect or variation includes temperature, chemical component of resist, stability of e-beam gun, and other environmental conditions. In one aspect, these variational effects are called lithography process variation hereafter. By these variations, the image obtained by the lithography changes to some extent. It may be required to estimate the influence of such variation to the image. The influence of the process variation to the image varies depending on a position of the image. It is difficult to evaluate each effect of the lithography process variation, but representing variation of those effects by change of threshold of lithography intensity is a reasonable way. Lithography process sensitivity is defined as influence of the threshold change to the change of the lithography image.

Figure 2B:
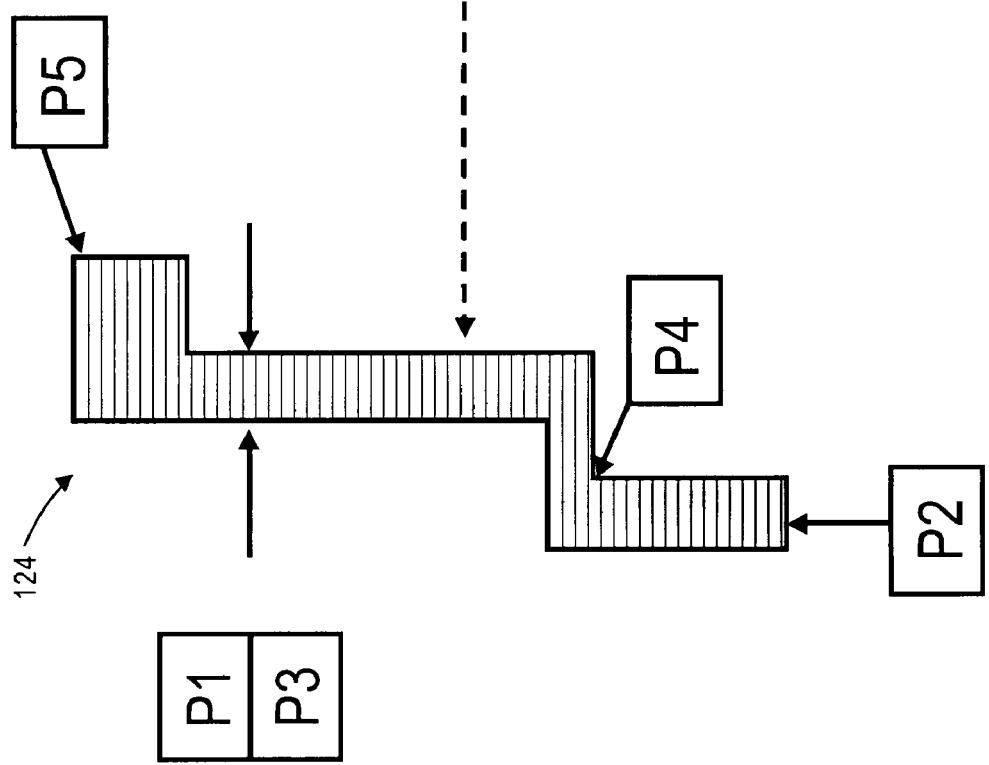
FIG. 2B shows a part of the IC Layout of FIG. 2A.
Figure 3:
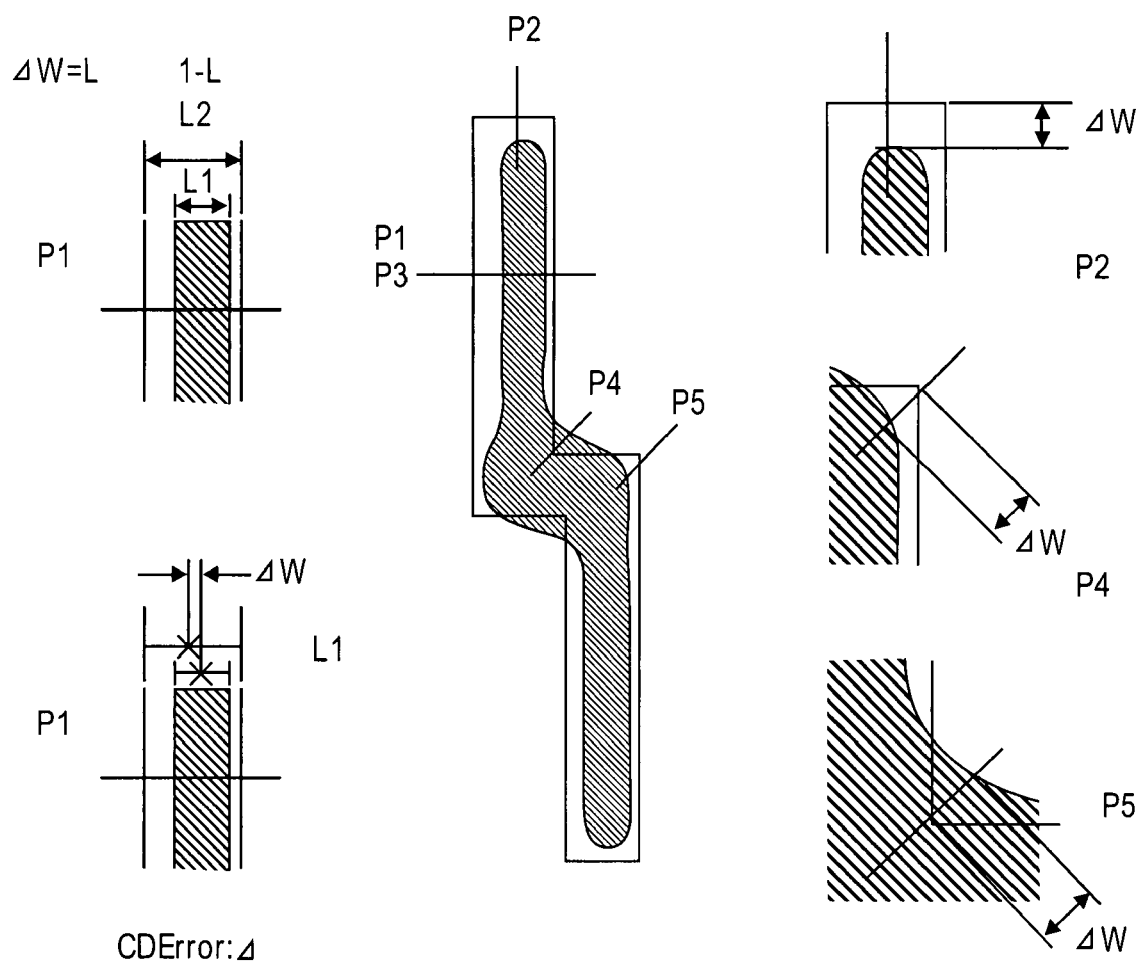
FIG. 3 shows CD measurement categories P1~P5.

FIG. 3 explains CD measurement categories with reference to CD measurement categories P1~P5 of FIG. 2B.

P1~P5 indicate categories for the CD markers. P1, for example, is a category that measures line width. P2, for example, is a category that measures shortening of line end. P3, for example, is a category that measures absolute distance between obtained image and target patterns. P4, for example, is a category that measures rounding at a convex vertex. P5, for example, is a category that measures rounding at a concave vertex.

In one aspect, categories P1~P5 intend to measure differences between obtained images and intended patterns. In a case of lithography simulation, evaluation of quantitative differences between images obtained by the simulation and intended pattern is important for quality control of the lithography.

In one aspect, CD measurement results in a number for quantitative quality control of the image obtained by lithography. Visible representation of a simulation result image, as shown in FIG. 1, for example, is helpful for intuitive understanding of the result but is not necessarily from qualitative quality control point of view.

FIG. 4 shows CD marker and evaluation points, and FIG. 4 explains detail of the CD marker, target pattern and evaluation points. In one embodiment, the target pattern may be required by the design, and the CD marker is a geometrical entity that is a critical region to be measured. In FIG. 4, AA' and BB' are examples of a CD marker, and the evaluation points are a set of coordinates where the lithography intensity is calculated. As shown in FIG. 4, CD markers are assigned to target patterns for indicating measurement points. In one aspect, AA' and BB' are examples of CD markers that are represented by line segments, for example.

In one embodiment, AA' is an example of CD marker usage that is applicable to the categories characterized by measuring distance between edges of the target pattern and image. P2, P4, and P5 of FIG. 3 are examples of this type. BB' is an example of CD marker usage that is characterized by measuring a difference between width of the image and the intended pattern. P1 is an example of this type of CD Marker. P3 in FIG. 3 is an example that measures difference of position between intended patterns and obtained images.

In one aspect, FIGS. 5A-5B show embodiments of a CD measurement method and a principle of CD measurement. Curves called Simulation Result indicate intensity of the lithography (deposition energy in e-beam case) on line segments AA' and BB'. Line graphs called Target are ideal intensity distribution for the target patterns. Horizontal lines called Threshold indicate level of lithography intensity that generates the lithography images.

FIGS. 5A-5B depict details of how CD values are measured by the embodiments in which CD markers are set, as shown in FIG. 4. Positional coordinates of placed CD markers are indicated on a horizontal axis. AA' of FIG. 5A corresponds to AA' in FIG. 4. Similar to the above example, BB' of FIG. 5B corresponds to BB' in FIG. 4. Vertical axis indicates an intensity of deposited energy of particles like electrons or photons that causes chemical reaction in the resist.

In one embodiment, intensity curves are calculated by simulation along with lines AA' and BB' and indicated by "Simulation Result" in FIGS. 5A and 5B. On the other hand, preferable intensity curves for getting the best images are step functions as shown by "Target" in FIGS. 5A-5B. Resist is modeled on a simple "Threshold" that determines where image appears. In FIGS. 5A-5B, image is developed in the area where intensity exceeds the "Threshold". This is a simple model but behavior of the resist is described. "CD Value" that is defined by the difference between target pattern and image by lithography is measured as a distance between a cross point of "Target" line and "Threshold" line and a cross point of "Simulation Results" and "Target" line. In FIG. 5A, CD value is distance between X1 and X2, and in FIG. 5B, CD value is calculated based on distances between X1'/X1" and X2'/X2".

In one aspect, the above description of CD measurement method indicates there is no need to calculate intensity of all grid points in the target region for calculating CD values. Calculation of intensity on the region related to a CD marker is sufficient. By one embodiment, the number of the intensity calculation is drastically reduced. In one embodiment, this method may obtain the same CD measurement results within approximately 1/40~1/90 of CPU time required for the conventional method that is described in FIG. 1. In one embodiment, the herein described method enables evaluation of specified critical dimensions of lithography image for large regions like a whole chip that was impossible by the conventional method.

Figure 6:
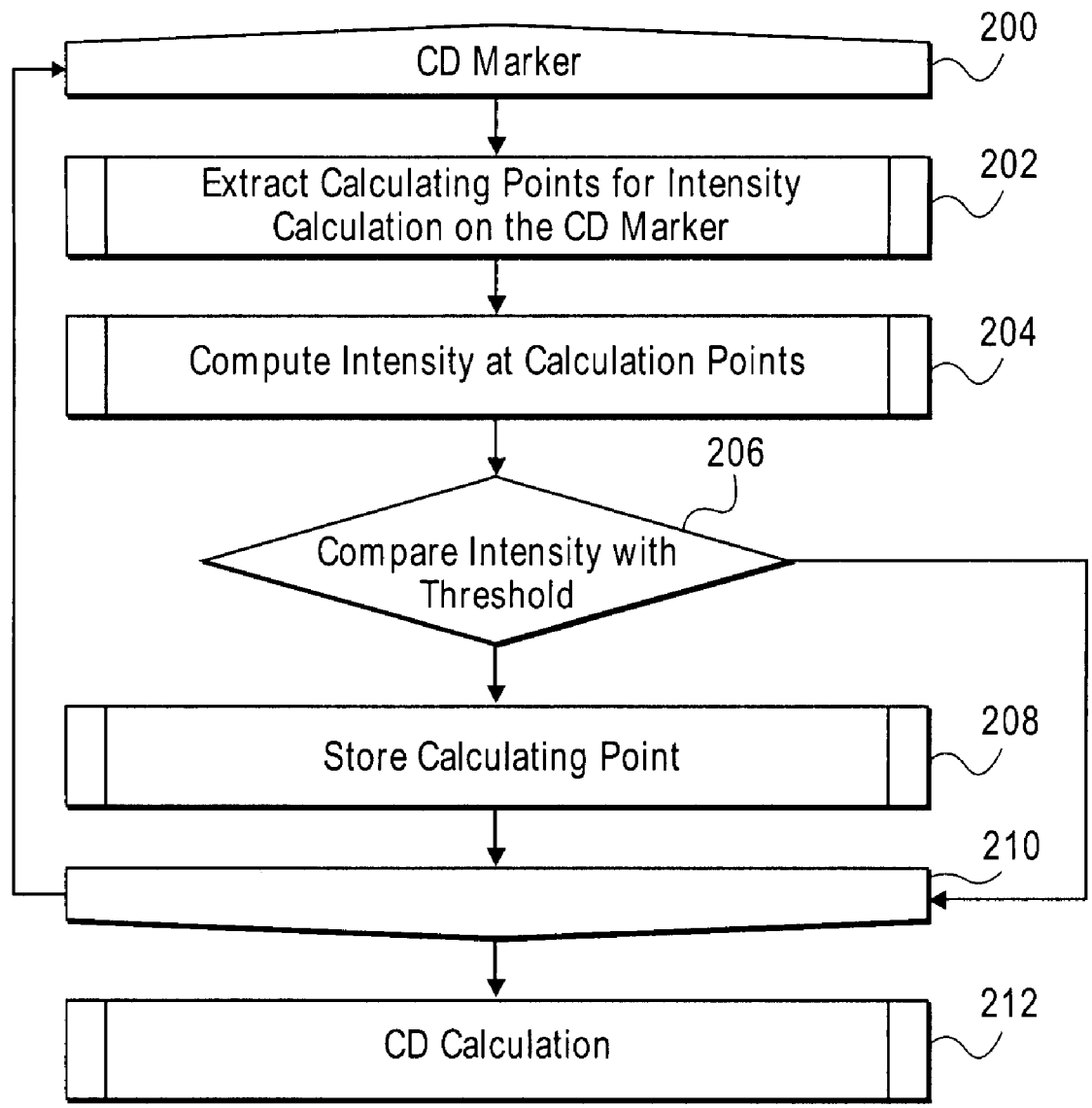
FIG. 6 shows one embodiment of a flowchart for CD Measurement.

The following description is an example of the embodiment of the CD measurement system. It should be appreciated that there are many other embodiments based on the invention. In one aspect, FIG. 6 shows one embodiment of a flowchart for CD measurement. An example of CD measurement procedure is shown in FIG. 6, wherein FIG. 6 shows one embodiment of a flowchart of the invention.

In one aspect, actions (200) and (210) of FIG. 6 respectively indicate a start point and end point of a repetition. It should be appreciated that actions between (200) and (210) can be repeated for all CD markers in an objective region.

In action (202), the intensity evaluation point(s) on the CD marker line segment is (are) determined.

In action (204), intensity of lithography on the point(s) determined in action (202) is (are) calculated.

In action (206), a threshold of the intensity and the intensity calculated in action (204) is compared.

In action (208), a point at which the intensity is equal to the threshold is stored in memory. In one aspect, storing formats of the point data for this action may depend on the category of the CD measurement. An quality check can be accomplished by action (206). If the equality check is not satisfied, action (208) will be skipped.

In action (212), CD values are calculated based on both the point information stored at action (208) and the category specified by the CD markers. In one aspect, examples of the category are depicted as P1~P5 of FIG. 3.

In one embodiment, lithography process sensitivity is a type of CD value. Different from category P1~P5 that are calculated based on intensity-threshold equivalent point information, the lithography process sensitivity is calculated based on an idea related to differential calculus. In lithography technology, gradient of the intensity curve near the threshold value is important. The sensitivity that is defined as influence of process variation to the image by the lithography (hereafter called lithography process sensitivity) decreases when the intensity curve is steep. In other words, the shape obtained by the lithography changes largely when the intensity curve is gradual.

In one embodiment, the CD measurement method is applicable for the above mentioned lithography process sensitivity check. A questionable area from lithography process sensitivity point of view is a region where $\Delta I$/distance (P1,P2) is less than a specified value, P1 is a point where intensity of the lithography is equal to the threshold, and P2 is a point where intensity of the lithography is equal to the threshold+$\Delta I$, where $\Delta I$ is a specified small value compared with the threshold value. This type of CD measurement is conventionally not easy to perform because the point where the intensity is equal to threshold+$\Delta I$ is difficult to observe in the resist. In one aspect, the CD measurement method allows estimation of this type of value by virtue of simulation base method.

Figure 7A:
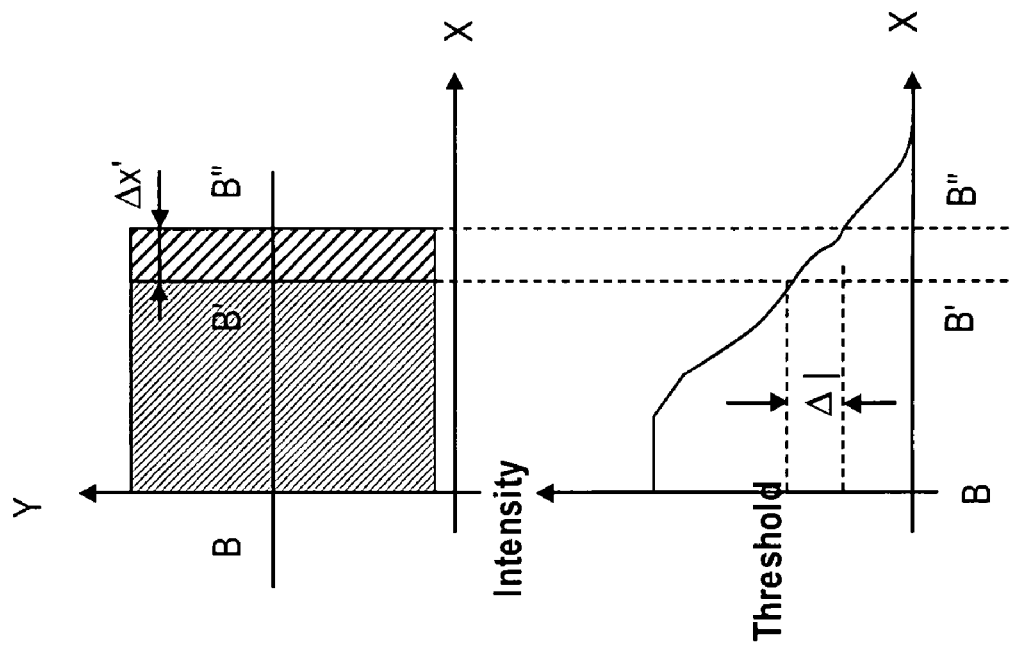
FIGS. 7A-7B shows sensitivity of an image to lithography variation.
Figure 7B:
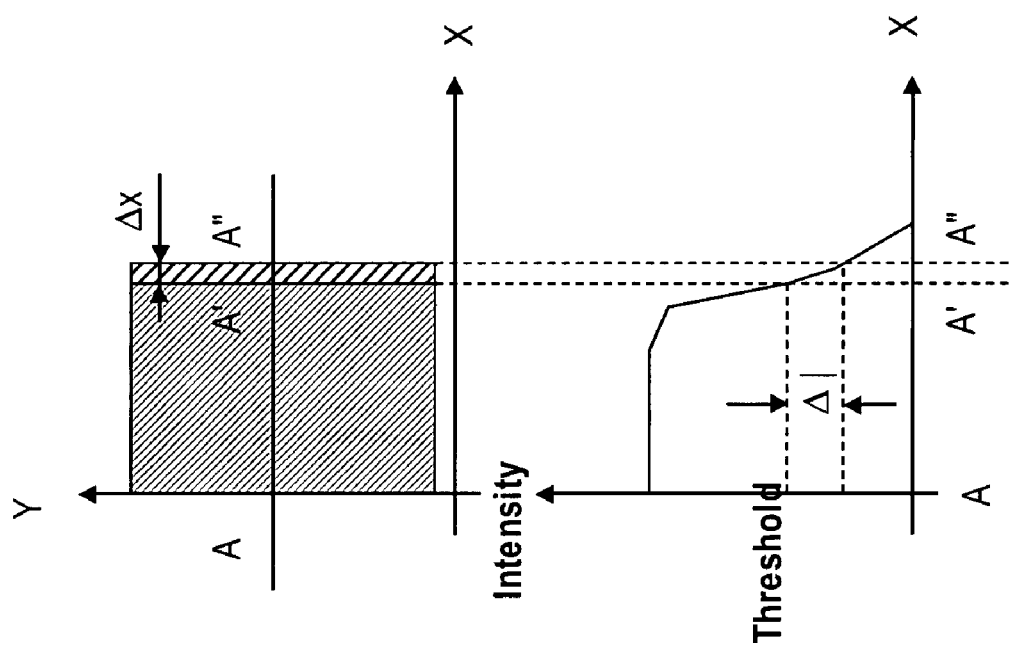

FIGS. 7A-7B show sensitivity of an image to lithography process variation. How process variations influences images obtained by lithography technologies is depicted in FIGS. 7A-7B. FIG. 7A shows, for example, a case where the intensity curve is steep at the cliff of the intensity. FIG. 7B shows a case where the intensity curve is gradual. In one embodiment, lower charts of FIGS. 7A and 7B show intensity curves on line AA' and BB', threshold levels, and threshold+$\Delta I$ level, and upper charts of FIGS. 7A and 7B show how the images that are developed in both case.

FIGS. 7A-7B depict how process variations influences images obtained by lithography technologies. In case of FIG. 7A, intensity curve is steep so that influence of the process variations on the images is relatively small. In case of FIG. 7B, gradient of intensity curve is gradual compared with case 7A, so that the image changes caused by lithography process changes (one example is variation of resist temperature) are larger than case 7A.

In FIGS. 7A and 7B, X-Y coordinates of upper chart of FIGS. 7A and 7B indicate geometrical positions on a plane coated by resist, and rectangles indicate the images obtained by lithography technologies. On the other hand, X-Y coordinates in lower part of FIGS. 7A and 7B indicate intensity of the lithography and geometrical positions on line AA" and BB". Image appears where intensity of energy, for example, exceeds predefined threshold. In one aspect, the threshold of the intensity varies depending on states of resist and other process parameters like temperatures. FIGS. 7A and 7B explain a case in that the threshold intensity decreases $\Delta I$ by variation of some process parameters. In case the threshold intensity decreases, intersections of the intensity curve and the threshold will shift from A' to A" and B' to B". As a result of threshold shift, a boundary of the image moves to a point of $\Delta x$ right, and the image becomes large. In case of FIG. 7B, the boundary of the image also moves to a point of $\Delta x'$ right, and the image becomes large. As a conclusion of the discussion on FIGS. 7A and 7B, $\Delta x < \Delta x'$ or the boundary move of (A) is smaller than that of FIG. 7B because the intensity curve for FIG. 7A is steeper than that for FIG. 7B.

In one embodiment, a system may be implemented that reports a subset of regions specified by CD markers that have potential risk of generating poor images because of the high lithography process sensitivity. The region where a distance between P(T) and P(T+$\Delta I$) is larger than a specified value related to the $\Delta I$ will be reported, where P(T) is a cross point of the intensity curve and threshold line, and P(T+$\Delta I$) is a cross point of the intensity curve and threshold+$\Delta I$ line on a CD marker line. This check is useful for identifying regions where generated images are potentially unstable for process variation in other word lithography process sensitivity is high.

Figure 8:
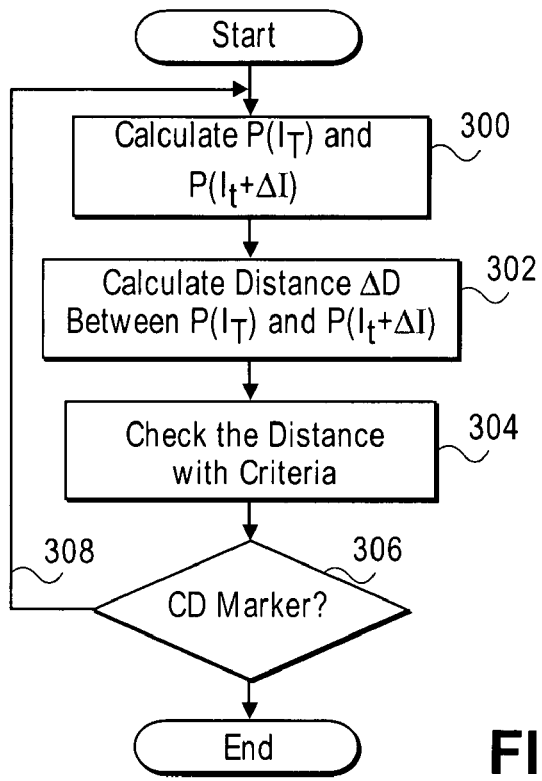
FIG. 8 shows a flow chart for high sensitivity point detection.

FIG. 8 shows a flow chart for high sensitivity point detection, and an example of lithography process sensitivity procedure is explained by a flow chart in FIG. 8. The sensitivity can be calculated as a part of CD measurement.

Some embodiments of lithography process sensitivity calculation method based on the invention is described below. Alternately; other embodiments may be possible. Embodiments of the method and flow are described by FIG. 8.

In 300: Calculation of point P ($I_T$) and P ($I_T+\Delta I$) on a specified CD Marker is done, where P($I_T$) is a cross point of the intensity curve and threshold line $I_T$ and P ($I_T+\Delta I$) is a cross point of the intensity curve and threshold+$\Delta I$.

In 302: Calculation of $\Delta D$=distance between P ($I_T$) and P ($I_T+\Delta I$) is performed, that is a distance between edges of the lithography images assuming $I_T$ and $I_T+\Delta I$ as threshold values.

In 304: Check whether calculated the distance $\Delta D$ of the action 302 is bigger than provided criteria. $\Delta D/\Delta I$ is an index that indicates deviation of the image by the threshold changes caused by the lithography process variation. Risk of the image deviation increases with increase of the sensitivity.

In 306: This is an action that checks completion of processing whole CD Markers. Loop 308 is a loop for repeating the remaining processes for CD Markers.

The lithography process sensitivity calculation method, as shown in FIG. 8, is an example of the embodiment and other embodiments using action 300, action 302, and action 306 can be possible.

The CD measurement of images by lithography technology can be performed quickly by the above mentioned methods. Efficient assignment of CD Markers at appropriate points is another issue. A method by conventional thinking is using layout database flattened by software and placing the markers at critical points by hand. However, it is tedious and time consuming to place CD markers at all critical points on a chip.

To resolve above mentioned marker assignment problem, the following method and system are disclosed. By the disclosed method, templates of CD markers are associated with critical points of polygons in library cells in advance, and a CD marker is generated based on the template to a position where the cell is placed and instantiated. By the mentioned method, the CD marker marking becomes effective because preparing the templates for a library cell makes possible to repetitively generate CD markers where cells are placed. In one example, to embody the mentioned method, (1) embedding templates for CD markers in library cells and (2) generating CD markers at where the cells are placed, may be required.

An embodiment of the disclosed method is control of CD marker generation by human operators' directions, which will be described in following section.

Figure 9A:
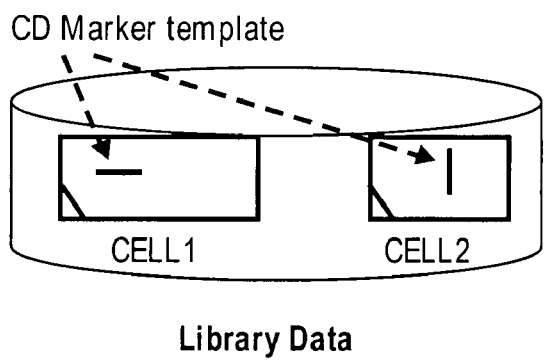
FIG. 9A shows CD Markers embedded in a cell library.
Figure 9B:
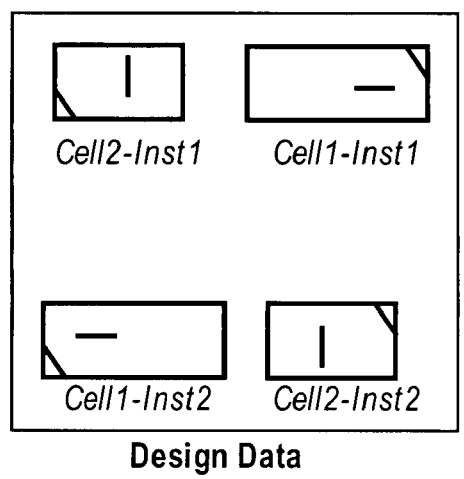
FIG. 9B depicts relations between CD marker template in library data.

FIG. 9A shows CD markers embedded in a cell library, and FIG. 9B depicts relations between CD marker template in library data, and how these templates are used in the design. FIG. 9A indicates a library where cells or blocks repetitively used are stored. FIG. 9B indicates a design that uses cells in the library. Cell 1 and Cell 2 are example names of the library cells. CD marker templates are associated with these library cells. In one aspect. both Cell 1 and Cell 2 are instantiated two times in design FIG. 9B.

In one aspect. FIG. 9A shows a library database in where cells, that may be used by a design, are stored. FIG. 9B shows an example of a design. In the example, both Cell A and Cell B are used twice for implementing the design. In one aspect, four times assignment of CD markers may be required if no design hierarchy information is used, as shown in FIG. 9B. In case of using design hierarchy like cell library, same CD marker assignment is performed by preparing two CD marker templates. Effect and operation of the method is explained by an example. A cell in the library is sometimes referenced more than thousands times in a common design. In such case, reduction of time and effort for the CD marker assignment is large.

Figure 10:
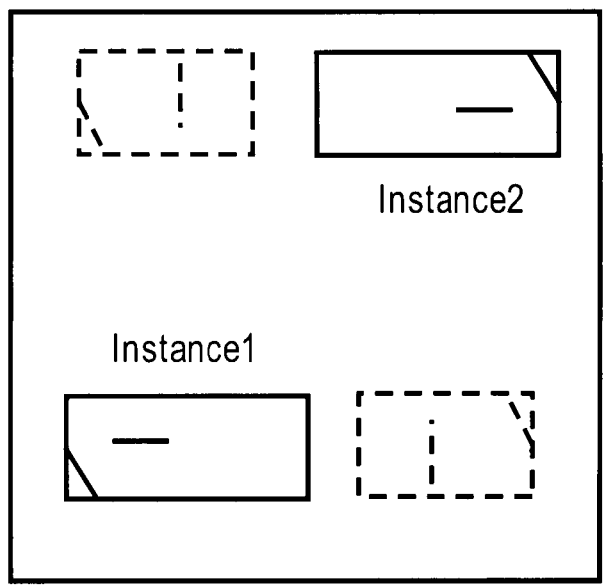
FIG. 10 shows a CD Marker selection by cell type.

FIG. 10 shows a CD marker selection by cell type. Generation of a CD marker is controlled by Cell name. FIG. 10 is an example that CD markers for cell 2 are not generated. FIG. 10 is an example that depicts merit of specifying template of the CD Marker by name of the cell type whether to generate CD Marker or not. Precise specification of cell instances for CD measurement can be doable by identifying it by cell types. FIG. 10 corresponds to FIG. 9B. Two instances of Cell 2 type in FIG. 10 are omitted from the evaluation objectives. The elimination operation can be easily performed by specifying cell types but not specifying cell instance one by one. Furthermore, using categories appeared in FIGS. 3 and 4 in reference to FIG. 10 allows more complex specification of CD measurement objectives. By virtue of this efficient filtering capability, it is more efficient to focus on a spot of interest and reduce computation time by eliminating unnecessary evaluation points.

Figure 11:
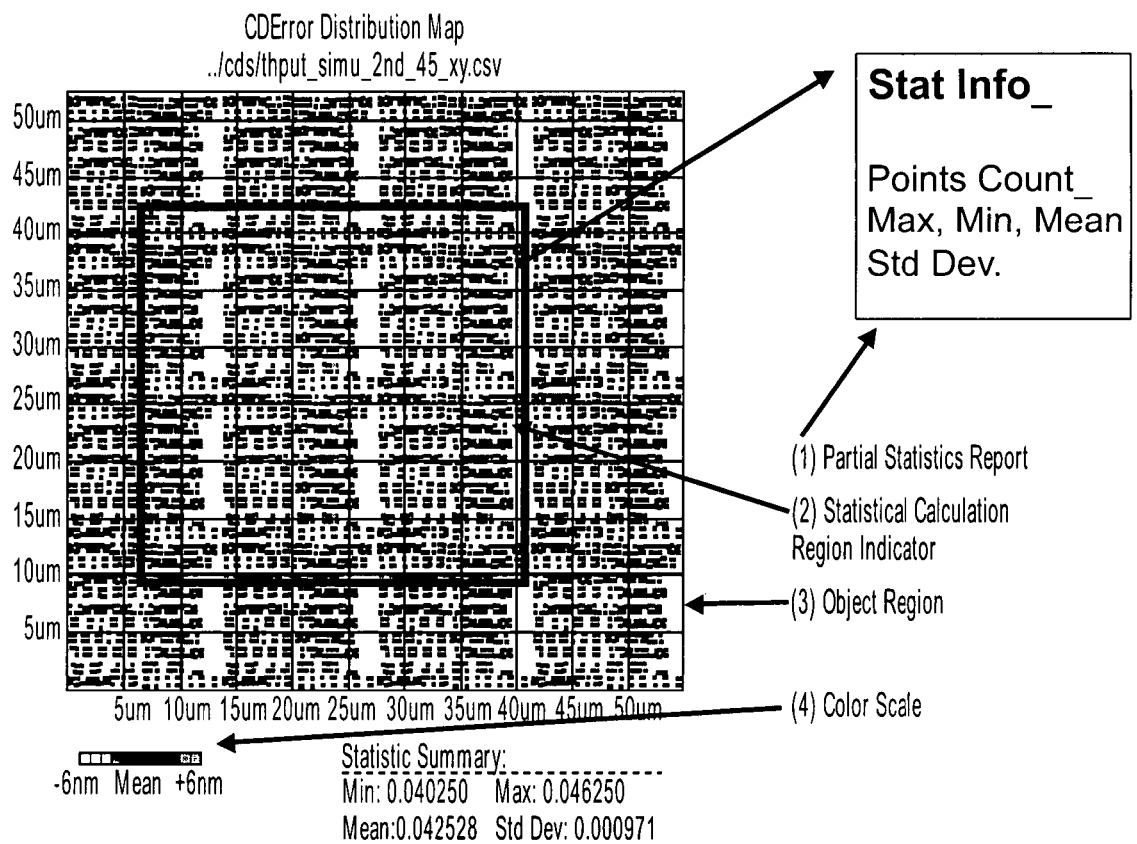
FIG. 11 shows an example of CD Measurement result display.

FIG. 11 shows an example of a CD measurement result display. Both layout and CD measurement results are displayed on a same screen. The value of the CD measurement results is indicated by color. (1) Partial statistics report shows statistic of a specified region. (2) Statistical Calculation Region indicator is used for specifying a region for the calculation. (3) Object Region is a region for the simulation. (4) Color Scale is used as a scale for the value of the CD measurement. CD measurement results are statistical quantities like average and standard deviation, and generally calculated for whole objective area. Partial statistical quantities of specified region are of interest for understanding result of dose correction.

FIG. 11 is an example of the display that are intended to fulfill one or more of the above mentioned requirements.

In one example, quantity of CD measurement results is displayed with a geometrical entity that is related to the CD marker. An example of the embodiment is using color for showing the quantity and polygon of the LSI layout for geometrical entity. FIG. 11 is an implementation that uses color and a rectangle related to the place of CD marker for display. By this display, a user of the system can intuitively understand CD measurement results.

In another example, partial statistical report generation capability is shown in FIG. 11. This capability allows the user to specify a region and to know partial statistical characteristics of the specified region. To satisfy such a requirement, the capability comprises a means for specifying one or more region(s) for statistical calculation, calculating statistical quantities of the specified region, and a means for displaying the calculation results. A system may comprise the above mentioned components.

FIG. 11 shows a statistical result display device as an embodiment. (1) Partial Statistic Report shows statistical calculation results for specified region. (2) Statistical Calculation Region Indicator shows a boundary of the region for statistical calculation. (3) Objective Region indicates whole area for the calculation. (4) Color Scale indicates quantitative result by CD measurement.

In one aspect, CD measurement result by lithography simulation is useful as a feedback to the engineers and is also helpful to improve design, proximity effect correction, dose correction, and RET (Resolution Enhancement Technology). Other uses of the CD measurement result assists inspection and measurement of real lithography images by CD SEM, for example.

Figure 12:
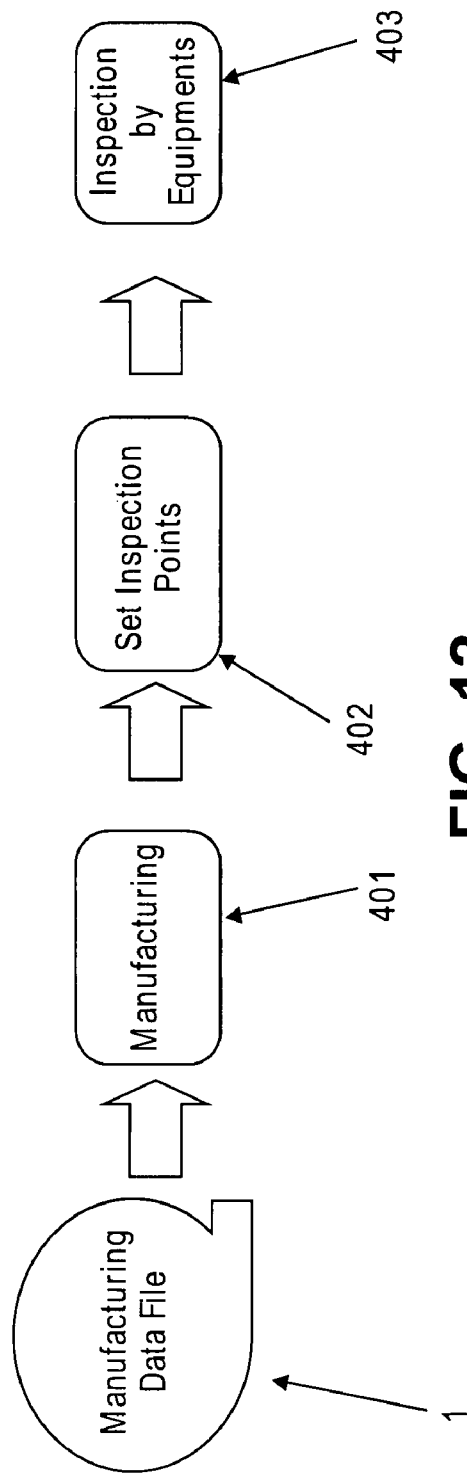
FIG. 12 shows a conventional interface to measurement equipment.

FIG. 12 shows a conventional interface to measurement equipment and shows a conventional process from the manufacturing data generation through the inspection. For example, data 1 shows manufacturing data generated by CAD equipment. Manufacturing is performed at 401. Inspection points for checking whether the product satisfies quality and spec are prepared and transferred to the inspection equipment at 402. Inspections are done at 403 according to the direction prepared at 402. From the described procedure, the conventional method for inspection cannot use useful information that is generated with Data 1 preparation. To resolve this issue, a new method is introduced, as shown in FIG. 13.

Figure 13:
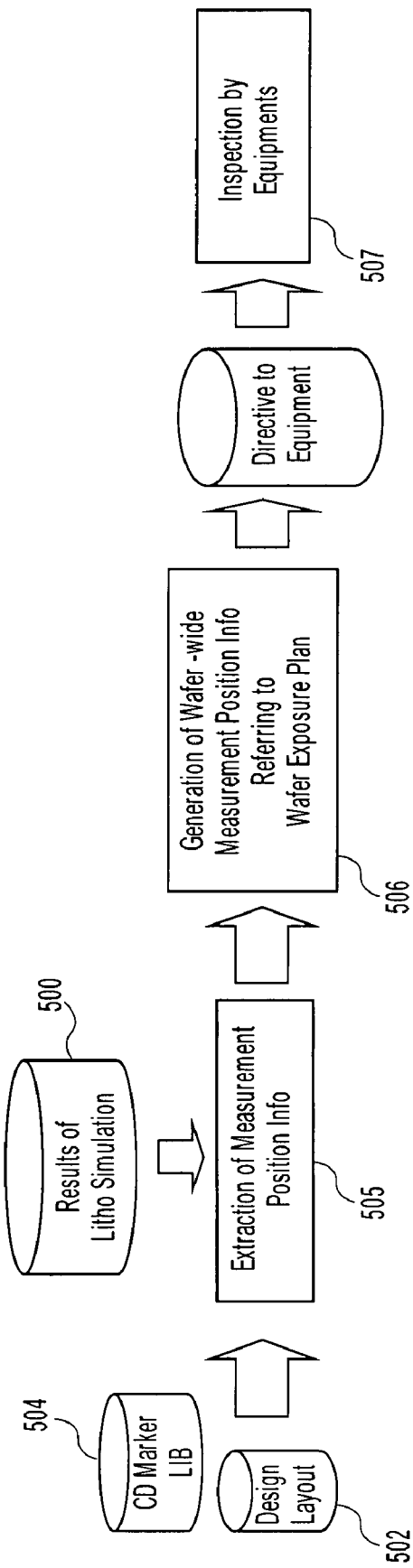
FIG. 13 shows one embodiment of an interface to measurement equipment.

FIG. 13 shows one embodiment of an interface to measurement equipment. Embodiments of an interface method of design information to inspection equipment is described. The design information includes lithography simulation results and CD marker information.

In the method depicted by FIG. 13, directive data for the inspection equipments is prepared using lithography simulation results 500, layout design data 502, and CD marker information 504. In one embodiment, the directive information including CD marker and geometrical shapes are provided to the inspection equipment, for example, CD SEM for automatic navigation of the equipment. Prioritizing CD markers can be based on the lithography simulation. The inspection or measurement is performed from highly prioritized CD markers to improve efficiency of the inspection. Effectiveness of the inspection can be improved by finding high lithography process sensitivity parts using the methods depicted by FIGS. 7A and 7B and transferring it to the equipment. The method is based on an idea of understanding which part of the design is less stable by using the simulator.

FIG. 13 shows an example of the interface method to measurement equipment by one aspect of the invention. The inputs of the methods are Design Layout (502), results of lithography simulation (500), and CD Marker library (504). The output of the method is a directive to the equipment. The directive information controls an inspection equipment in a effective manner. That means, in one aspect, minimize or at least reduce the measurement time needed to measure the critical dimensions. In 505, a set of measurement positions on a chip is determined using a set of information shown by 500, 502 and 504. In one aspect, Prioritization or selection of the points can be done from efficiency point of view, for example, at 505. In 506, a chip level coordinate information is transformed in a wafer level because measurement or inspection of the fabricated chip is done on a wafer.

Figure 14:
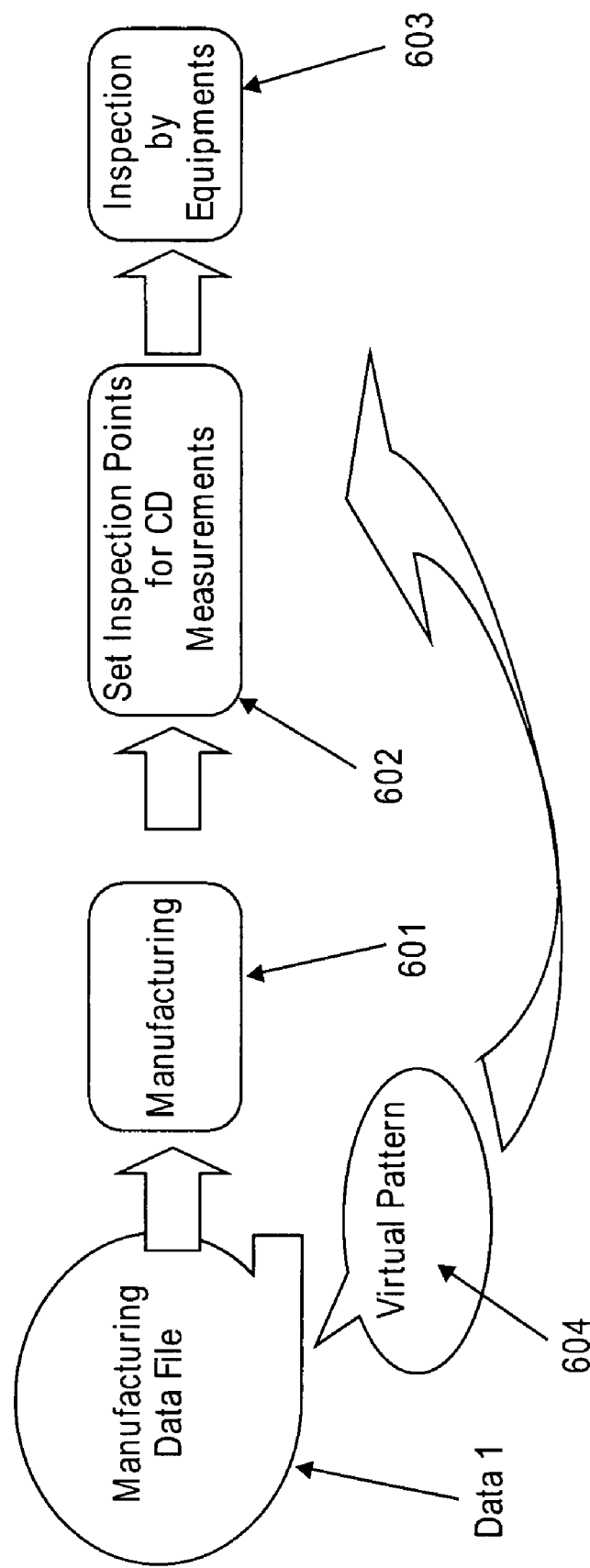
FIG. 14 shows one implementation example of transferring CD measurement information to inspection equipment.

FIG. 14 shows one implementation of transferring CD measurement information to inspection equipment. In one aspect, Data 1 and actions 601, 602, and 603 are identical to that of FIG. 12. In 604, virtual pattern by lithography simulation and CD markers is created.

In one embodiment, as shown in FIG. 14, a virtual pattern 604 is generated and helps the inspection. Data 1 is manufacturing data and a product is manufactured at 601 using the data. In 602, CD measurement information like inspection points is transferred to an inspection equipment at 603.

Figure 15:
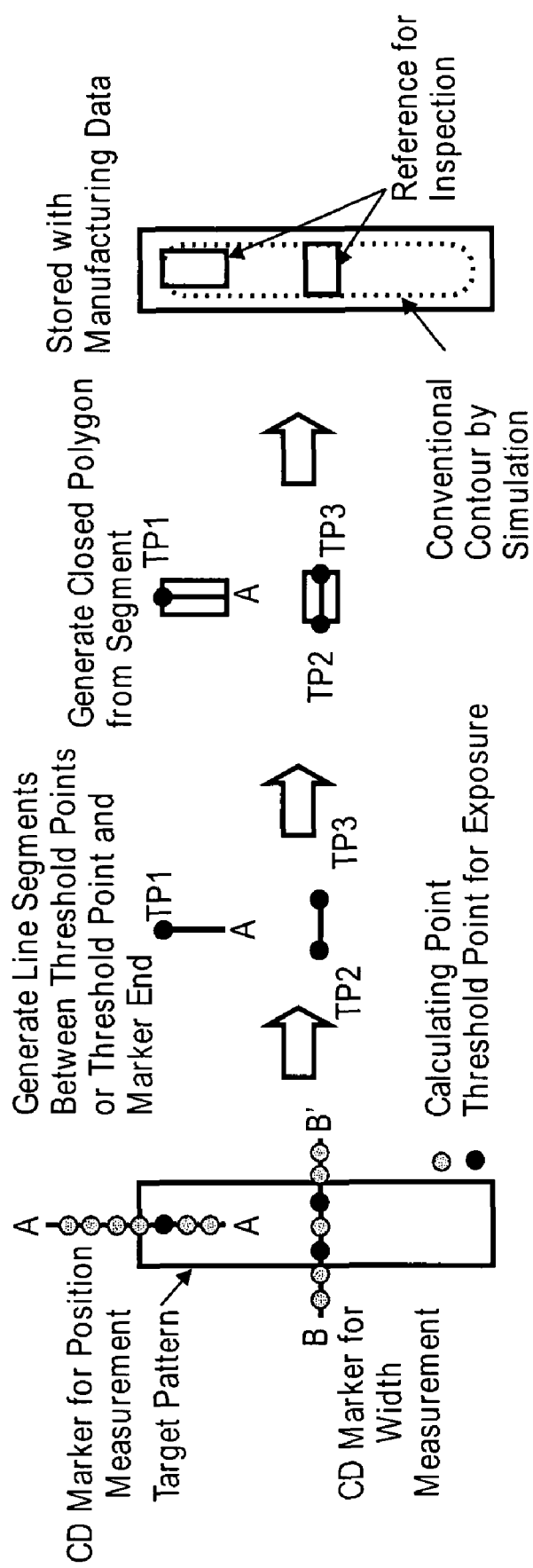
FIG. 15 shows an example of virtual pattern generation.

FIG. 15 shows an example of virtual pattern generation. A method for generating virtual pattern is described.

FIG. 15 depicts an example of generating virtual patterns for the inspection equipment. In one example. a virtual pattern may comprise a closed polygon generated based on line segments TP1-A' and TP2-TP3. TP1, TP2 and TP3 are points on CD marker lines and lithography intensity equal to the threshold. These virtual patterns are sent to the equipment and used for helping the inspection.

At the inspection equipment, the above described virtual patterns are useful for the following purposes. (1) A pointer helps visual check by operators and is also helpful for indicating a next checking object. (2) References for comparison are useful because the virtual patterns are generated based on lithography simulation, and they indicate a line edge of the lithography images.

In conventional lithography simulation, all grid points of an object domain are to be evaluated for getting intensity of the lithography. For E-beam case the intensity is deposition energy. Image generated by the lithography is conventionally obtained by a contour line tracking program that finds out equi-threshold intensity points for the image development and connects those points. The conventional method is time consuming. In one embodiment, the method may significantly reduce computation time by focusing the computing domain using CD markers.

In one embodiment, assignment of the CD markers to regions of interest may be required. In real mask fabrication and wafer production, the number of CD measurement points is limited because of time needed for evaluation. In one aspect, the CD measurement may have a merit that allows a huge number of measurements compared with the conventional real measurement. In general, it may require a preparation of huge CD markers that number is equal to the measurement points. In another aspect, a template for a CD marker may be embedded into a library cell or block, which reduces time for CD marker assignment. This may improve efficiency of the CD marker setting.

Lithography process sensitivity that indicates influence of lithography process variation to the obtained lithography image is a conventionally used idea. However, the conventional method requires evaluation of all grid points of an object domain. Different from conventional methods, some embodiments of the method may calculate the sensitivity effectively by using a method for CD Measurement. The calculation is effective and quick because it may be done in the limited area specified by the CD marker.

In conventional CD measurement that is used for measurement of real masks and wafers, the measurement points are so small that few need of visual display of the result is said. However, the above mentioned technology invokes a need for intuitive understanding. In contrast, the displaying method enables visual understanding of relation between CD measurement results and layout image. For some users, it is useful to know partial statistical quantities like average and standard deviations. The method uses layout image display and means for specifying a region for the partial statistical calculation, which allows users a convenient means of giving directions. Conventionally, there is no such way of the specifying area for the calculation.

In general, CD measurement is an important activity that is used for analyzing issues in a fabrication process and a judgment of whether a product is good or not. Unfortunately, in conventional system, decision of points for CD measurement is independently done in the manufacturing process. Some embodiments of the invention enable providing the CD measurement activity with CD markers and related data from the design side. Moreover, some embodiments of the invention enable prioritizing and sorting CD Markers for effective CD measurement by using lithography simulation results in design domain.

In one embodiment, some methods disclosed herein may be applicable for simulation of mask and wafer writing by electron beam lithography and may be applicable for the simulation of mask and wafer writing by more general charged particle beam writing.

In another embodiment, some methods disclosed herein may be applicable for the simulation of the mask and wafer writing by optical lithography.

In another embodiment, some methods disclosed herein may be applicable to, but not limited to, mask and wafer writing but also for more general lithography technologies.

In some embodiments, as previously discussed herein, a CD marker generation method that uses a template for the marker, which is embedded in parts of a layout like standard cell library or layout blocks, is disclosed. In some instances, there are many layout patterns that may not be included in parts of the layout, such as cells or blocks, but placed out of the parts. Examples include wire and via patterns. In alternate embodiments of the invention, a method that provides a more general solution for CD marker generation and addresses these issues will be disclosed in greater detail. In one embodiment, this generally applicable CD marker generation and placement method references layout patterns directly for the generation is disclosed.

Figure 16:
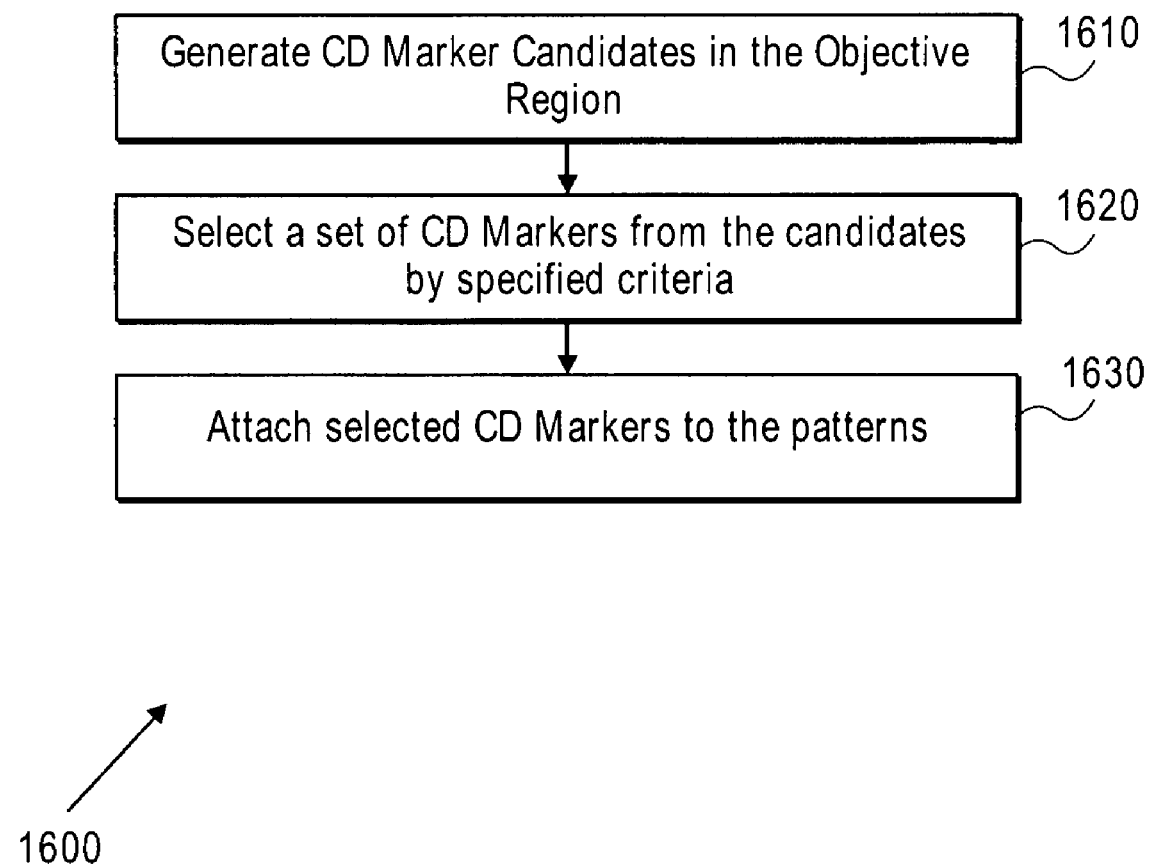
FIG. 16 shows an embodiment of a CD marker generation flow.

FIG. 16 shows one embodiment of a CD marker generation method and process flow 1600. In 1610, a CD marker candidate is generated for a specified subject region. In one aspect, the CD marker candidate may be generated without considering a detailed specification. In 1620, a CD marker is selected from the candidates by a specified condition, such as position, number of the CD marker, performance of corresponding circuits, evaluation results of a previously generated neighboring CD marker, and status of a target layer of the specified region. In one aspect, the CD marker may be selected from the candidates by a detailed specification for generating a set of measurement points suitable for a measurement. In 1630, a selected CD marker is stored in a database. In one aspect, the CD marker may be assigned to one or more layout patterns.

In an alternate embodiment of the method and process flow 1600, 1610 and 1620 of FIG. 16 may comprise a repetitive loop, and scanning the subject region to find the CD marker candidate and to make selection one after another may occur in 1620 of FIG. 16.

Figures 17A, 17B:
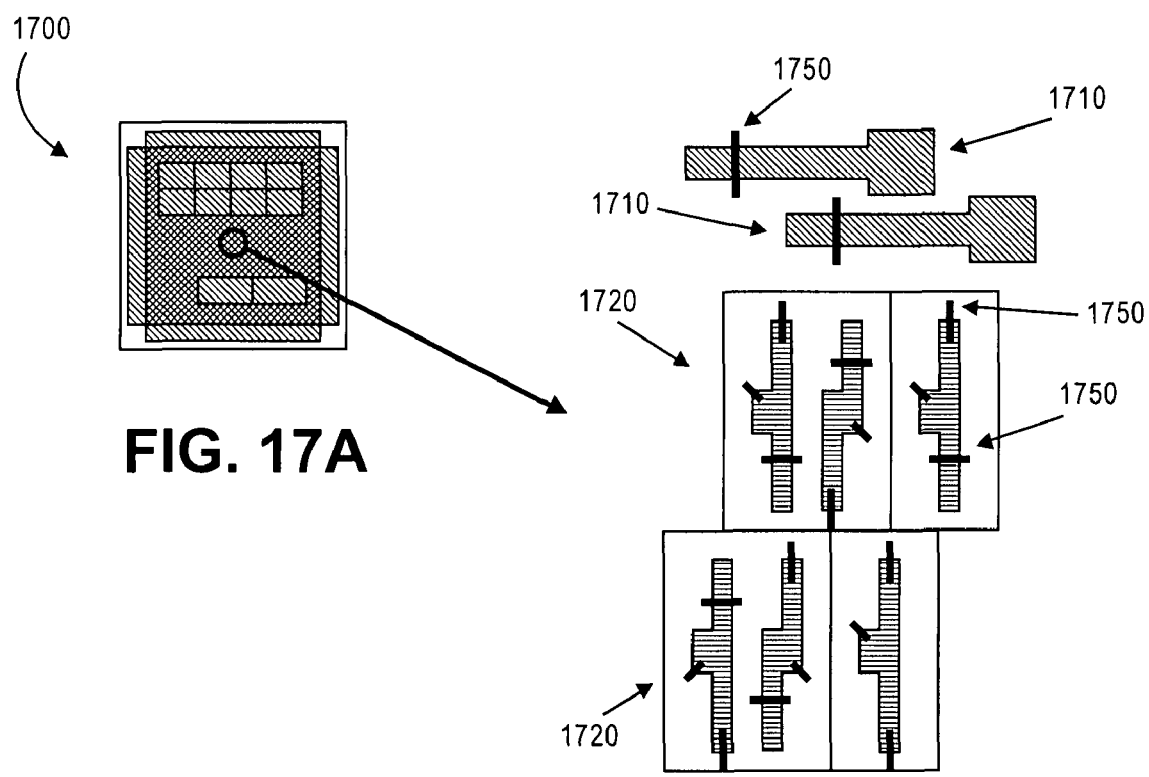
FIGS. 17A-17B show an embodiment of CD markers embedded in a layout design.

FIGS. 17A-17B show an embodiment of CD markers 1750 embedded in a layout design. In particular, FIG. 17A shows one embodiment of a layout 1700, such as a whole chip image, and FIG. 17B shows an enhanced or magnified portion of the layout 1700 of FIG. 17A.

As shown in FIGS. 17A and 17B, a CD marker 1750 is assigned to one or more wire patterns 1710 and one or more cells 1720. In one aspect, CD markers 1750 may be assigned to wire patterns 1710 that are not involved in a standard cell and also to patterns in standard cells. Based on a various layout designs, CD markers 1720 for a specified category may be generated.

In one embodiment, CD marker candidates may be generated based on results of geometrical Boolean operations between patterns in different layers and results of analysis between patterns. For a gate length case, a CD marker may be generated in a region where one or more poly-silicon patterns and diffusion patterns are overlapping.

In one aspect of applicable manufacturing designs, it may be impractical to generate CD markers for each and every location of the layout pattern and accomplish lithography simulation due to a huge number of patterns where cells and blocks are placed on a chip. A CD marker generation method for CD measurement and simulation by selection of CD marker candidates will be described herein.

Figure 18:
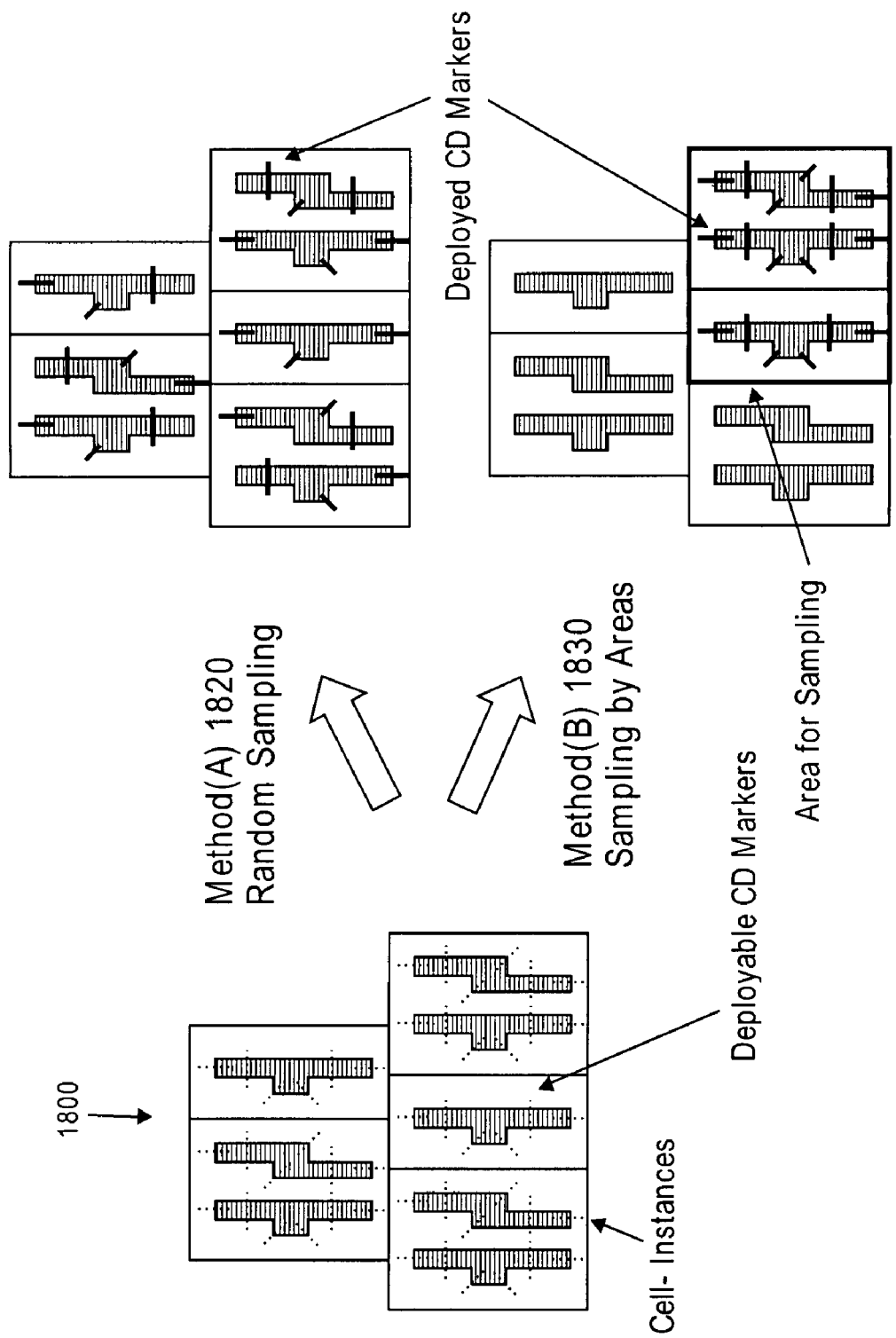
FIG. 18 shows some examples of sampling CD markers.

In one embodiment, FIG. 18 shows selection of a CD marker from CD marker candidates. Method (A) 1820 of FIG. 18 shows the selection of CD marker for reducing a number of a sample set by using randomly generated numbers. Method (B) 1830 of FIG. 18 shows the selection of CD marker by the spatial region.

Although many selection methods may be considered, FIG. 18 depicts various embodiments of selection. FIG. 18 shows a magnified view of the layout pattern 1800 having at least five cell instances. Method (A) 1820 of FIG. 18 shows one embodiment of a random sampling method that randomly selects a CD marker from the candidates. Method (B) 1830 of FIG. 18 shows one embodiment of a method that selects a CD marker from the candidates by a specification. In one aspect, both methods 1820, 1830 are applicable for reduction of CD measurement points. In one embodiment, method (B) 1830 is a practical way of the selection for generating a uniform CD marker distribution, wherein an example of an embodiment includes generation of regions that are uniformly distributed in a chip and selection by the regions. In one embodiment, method (A) 1820 may be suitable for estimation based on statistical sampling theory.

In one aspect, for more specific and efficient CD marker selection for CD measurement, use of circuit related information is feasible. In one example, use of important circuit information on a design may increase the efficiency and coverage of the CD measurements.

Figure 19B:
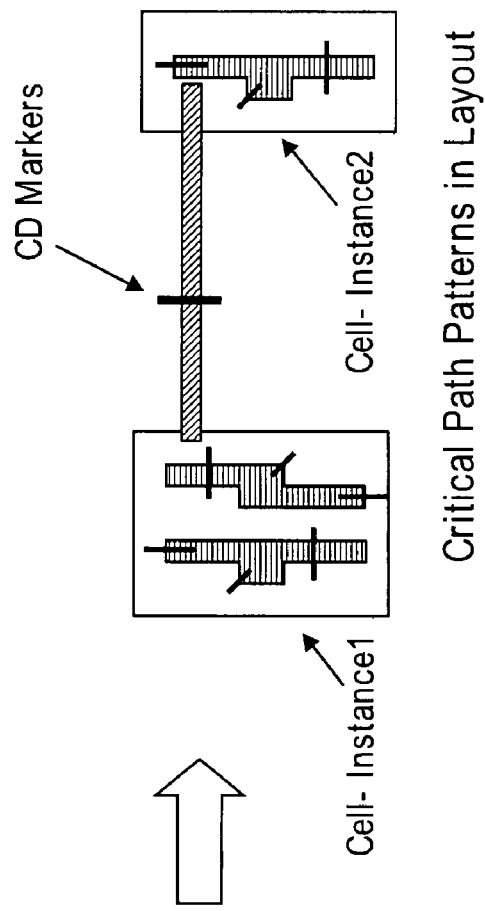
FIGS. 19A-19B show an embodiment of CD markers embedded using critical path information.
Figure 19A:
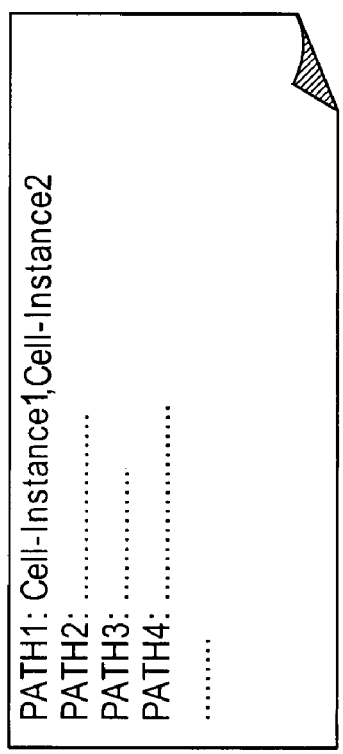

FIGS. 19A and 19B shows one embodiment of CD marker selection using corresponding circuit information. FIG. 19A shows a timing analysis result of the corresponding circuits, wherein PATH1 is in a critical path that may cause timing issues in the circuit. FIG. 19B shows a result of CD marker selection by the information of FIG. 19A, wherein a CD marker is generated for a wiring pattern in the critical path.

In one aspect, FIGS. 19A and 19B show critical path information that is used for the important circuit information. FIG. 19A shows various embodiments of critical path information. In one example, Critical Path-1 includes Cell-Instance-1, Cell-Instance-2, and a wire that connects both cells. In one embodiment, FIG. 19B shows critical path patterns in a layout related to the critical path. In one aspect, using this relation of identifying the patterns on the layout design from critical path information, CD markers can be assigned to the patterns.

As another effective CD marker selection method, use of CD measurement results for the selection of CD marker is possible. In one example, when focusing on patterns with bad CD measurement results, many CD markers may be selected near patterns with bad CD measurement results or the pattern itself for an increase in coverage of the measurement.

Figures 20A, 20B:
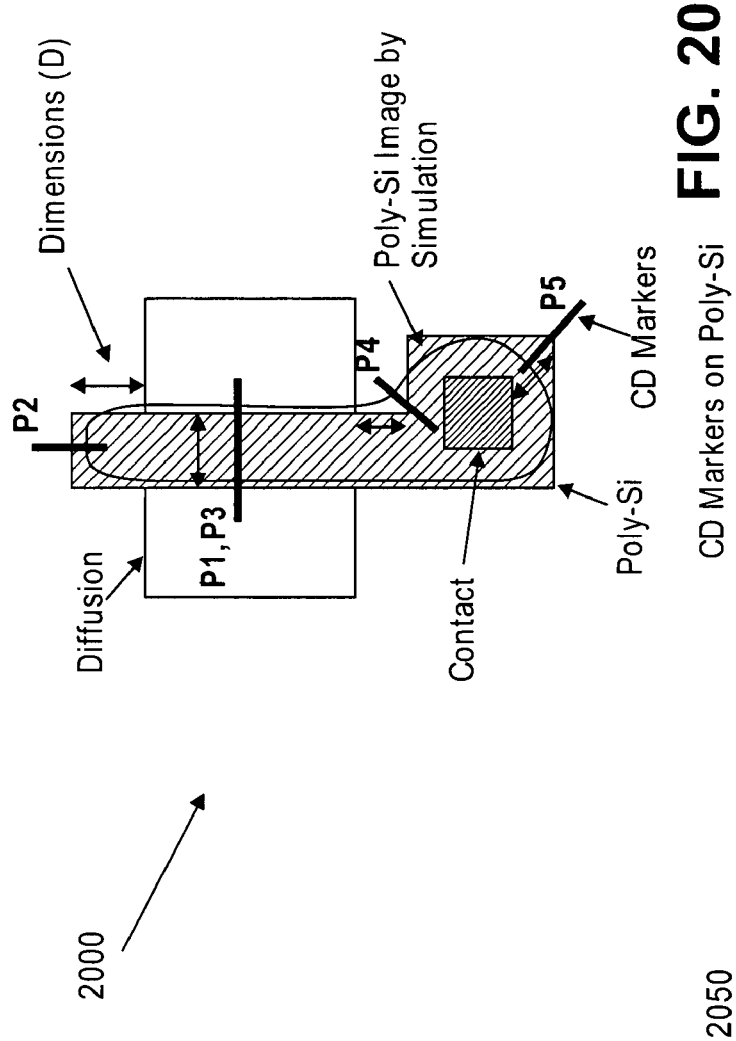
FIGS. 20A-20B show an embodiment of generation of CD markers by dimension conditions.

In addition to the CD marker selection method, referring to FIGS. 20A and 20B, CD marker candidate generation may improve efficiency of the CD measurement. In various embodiments, several CD measurement categories may be considered. For poly-silicon layer pattern case, P1: gate length of MOS transistor, P2: end-cap, P3: gate position, P4: concave corner, and P5: convex corner may be required to check. Even in P1 category, several gate lengths are found. In one aspect, there are allowed gate lengths and some false candidates. By eliminating those false candidates, the efficiency can be improved, and filtering those false candidates can improve efficiency of CD marker generation. Pattern width, length and distances between patterns can be as a filter. In one aspect, a reason for the generation of false candidate may be that geometrical Boolean operations without consideration of circuits may make candidates meaningless from other points of view like circuit operation.

FIGS. 20A and 20B show an embodiment of a condition list that may be used to avoid the selection of meaningless and unnecessary CD markers and conditions for eliminating false candidates. FIG. 20A shows categories 2000 for poly-silicon and examples of CD markers for each category of poly-silicon patterns. FIG. 20B shows an example of a condition list 2050 that describes measurement categories, dimensions to be measured, and an allowed range of dimensions. FIG. 20(B) also describes a table of conditions that are satisfied by each CD marker category. In one embodiment, generation of unnecessary CD markers may be avoided using this table of condition list 2050. In addition, effective CD measurement may be achieved by selecting and placing CD markers that satisfy a dimensional condition of, for example, "Minimum<D<Maximum" for each category.

In some embodiments, to overcome the limitations of where a CD marker can be placed because a template of the CD marker is embedded in a standard cell, some embodiments of the invention provide an increased area for placing CD markers on a layout by eliminating constraints of the placing area for CD marker candidates. Due to an increased flexibility of CD marker placement, some embodiments of the invention provide a method for setting CD marker at a position suitable for evaluating sensitivity to circuit performance and sensitivity to a lithography process becomes possible. In one aspect, a CD marker more suitable for such a purpose can be placed. As a result, saving a CD marker set in computer storage like file and improving the CD marker set by adding new CD markers become possible. For rapid lithography image computing and measurement, a CD marker may be placed on the layout design for indicating an evaluation point so as to provide effective generation and placement of the CD marker.

Figure 21:
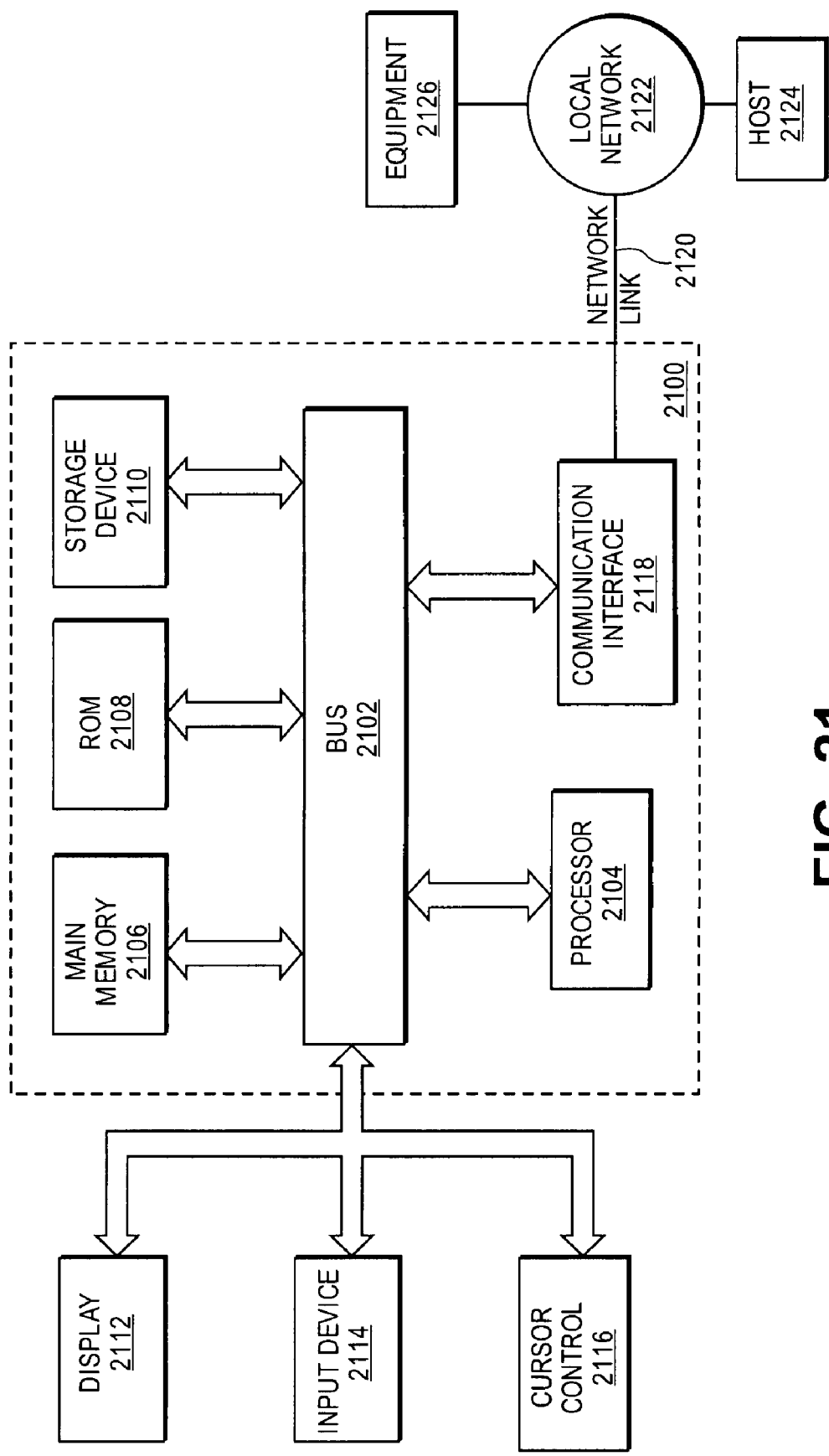
FIG. 21 shows one embodiment of a computer system with which embodiments of the invention may be implemented.

FIG. 21 shows an example of an embodiment of a block diagram of a computer system 2100 that may be used to implement embodiments of the invention described herein. In particular, the computer system 2100 stores and executes a computer software program for performing any of the functions or actions described herein. The computer system 2100 includes a bus 2102 or other communication mechanism for communicating information, and a processor 2104 coupled with the bus 2102 for processing information. The computer system 2100 also includes a main memory 2106, such as a random access memory (RAM) or other dynamic storage device, coupled to the bus 2102 for storing information and instructions to be executed by the processor 2104. The main memory 2106 also may be used for storing temporary variables or other intermediate information during execution of instructions to be executed by the processor 2104. The computer system 2100 further includes a read only memory (ROM) 2108 or other static storage device coupled to the bus 2102 for storing static information and instructions for the processor 2104. A data storage device 2110, such as a magnetic disk or optical disk, is provided and coupled to the bus 2102 for storing information and instructions.

The computer system 2100 may be coupled via the bus 2102 to a display 2112, such as a cathode ray tube (CRT), for displaying information to a user. An input device 2114, including alphanumeric and other keys, is coupled to the bus 2102 for communicating information and command selections to processor 2104. Another type of user input device is cursor control 2116, such as a mouse, a trackball, or cursor direction keys for communicating direction information and command selections to processor 2104 and for controlling cursor movement on display 2112. This input device typically has two degrees of freedom in two axes, a first axis (e.g., x) and a second axis (e.g., y), that allows the device to specify positions in a plane.

Embodiments of the invention are related to the use of computer system 2100 for lithography simulation and measurement of critical dimensions with improved CD marker generation and placement. In one embodiment, such use is provided by computer system 2100 in response to processor 2104 executing one or more sequences of one or more instructions contained in the main memory 2106. Such instructions may be read into the main memory 2106 from another computer-readable medium, such as storage device 2110. Execution of the sequences of instructions contained in the main memory 2106 causes the processor 2104 to perform the process actions described herein. One or more processors in a multi-processing arrangement may also be employed to execute the sequences of instructions contained in the main memory 2106. In alternative embodiments, hard-wired circuitry may be used in place of or in combination with software instructions to implement some embodiments of the invention. Thus, embodiments of the invention are not limited to any specific combination of hardware circuitry and software.

The term "computer-readable medium" as used herein refers to any medium that participates in providing instructions to the processor 2104 for execution. Such a medium may take many forms, including but not limited to, non-volatile media, volatile media, and transmission media. Non-volatile media include, for example, optical or magnetic disks, such as the storage device 2110. Volatile media include dynamic memory, such as the main memory 2106. Transmission media include coaxial cables, copper wire and fiber optics, including the wires that comprise the bus 2102. Transmission media may also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer may read.

Various forms of computer-readable media may be involved in carrying one or more sequences of one or more instructions to the processor 2104 for execution. For example, the instructions may initially be carried on a magnetic disk of a remote computer. The remote computer may load the instructions into its dynamic memory and send the instructions over a telephone line using a modem. A modem local to the computer system 2100 may receive the data on the telephone line and use an infrared transmitter to convert the data to an infrared signal. An infrared detector coupled to the bus 2102 may receive the data carried in the infrared signal and place the data on the bus 2102. The bus 2102 carries the data to the main memory 2106, from which the processor 2104 retrieves and executes the instructions. The instructions received by the main memory 2106 may optionally be stored on the storage device 2110 either before or after execution by the processor 2104.

The computer system 2100 also includes a communication interface 2118 coupled to the bus 2102. The communication interface 2118 provides a two-way data communication coupling to a network link 2120 that is connected to a local network 2122. For example, the communication interface 2118 may be an integrated services digital network (ISDN) card or a modem to provide a data communication connection to a corresponding type of telephone line. As another example, the communication interface 2118 may be a local area network (LAN) card to provide a data communication connection to a compatible LAN. Wireless links may also be implemented. In any such implementation, the communication interface 2118 sends and receives electrical, electromagnetic or optical signals that carry data streams representing various types of information.

The network link 2120 typically provides data communication through one or more networks to other devices. For example, the network link 2120 may provide a connection through local network 2122 to a host computer 2124 or to another equipment 2126. The data streams transported over the network link 2120 may comprise electrical, electromagnetic or optical signals. The signals through the various networks and the signals on the network link 2120 and through the communication interface 2118, which carry data to and from the computer system 2100, are exemplary forms of carrier waves transporting the information. The computer system 2100 may send messages and receive data, including program code, through the network(s), the network link 2120, and the communication interface 2118.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed is:

1. A computer implemented method for lithography simulation comprising:
specifying a position for measuring a difference between a lithography image and a target pattern;
generating one or more critical dimension (CD) marker candidates for the target pattern by using a template having one or more CD markers; and
selecting, by using a processor, a CD marker candidate from the one or more CD marker candidates as a CD marker for the target pattern, in which selecting the CD marker candidate comprises combining a spatial region specification, a decision using a number, information of a circuit that is realized by a layout pattern of the lithography image, CD measurement results, and a gradient of pattern density.

2. The method claim 1, wherein generating one or more CD marker candidates includes generating a set of CD marker candidates.

3. The method claim 2, wherein selecting at least one CD marker from the one or more CD marker candidates includes selecting at least one CD marker from the set of CD marker candidates.

4. The method of claim 1, wherein the act of generating the one or more CD marker candidates comprises using at least two pattern layers including a pattern layer to be measured by a category and another pattern layer needed for defining the category of measurement.

5. The method of claim 1, wherein the act of selecting the CD marker candidate is controlled by at least one number that specifies an allowable region for a CD marker category and an expected value of the one or more CD marker candidates.

6. The method of claim 1, wherein the act of selecting the CD marker candidate is achieved by specifying a spatial region.

7. The method of claim 1, wherein selecting the CD marker candidate is achieved by using a randomly generated number and a decision process related to the randomly generated number.

8. The method of claim 1, wherein the act of selecting the CD marker candidate is achieved by using information of a circuit that is realized by at least one layout pattern of the lithography image.

9. The method of claim 1, wherein the selected CD marker includes category information that determines CD measurement results.

10. The method of claim 9, wherein selecting the at least one CD marker or generating the one or more CD marker candidates is achieved by using the CD measurement results.

11. The method of claim 1, wherein the act of selecting the CD marker candidate or the act of generating the one or more CD marker candidates comprises using a gradient of pattern density that is defined by a ratio of difference of pattern area per unit area between neighborhood area.

12. The method of claim 1, in which the number comprises a randomly generated number.

13. The method of claim 1, further comprising storing a set of generated CD markers.

14. The method of claim 13, further comprising adding a newly generated CD marker to the set of CD markers.

15. A computer system for lithography simulation comprising:
a processor that is to:
specify a position for measuring a difference between a lithography image and a target pattern;
generate one or more critical dimension (CD) marker candidates for a subject region by using a template having one or more CD markers; and
select a CD marker candidate from the one or more CD marker candidates as a CD marker for the subject region, in which the selecting the CD marker candidate comprises combining a spatial region specification, a decision using a number, information of a circuit that is realized by a layout pattern of the lithography image, CD measurement results, and a gradient of pattern density.

16. The system of claim 15, wherein the generating one or more CD marker candidates includes generating a set of CD marker candidates.

17. The system of claim 16, wherein the selecting at least one CD marker from the one or more CD marker candidates includes selecting at least one CD marker from the set of CD marker candidates.

18. The system of claim 15, wherein the processor that is to generate the one or more CD marker candidates is at least further to use at least two pattern layers including a pattern layer to be measured by a category and another pattern layer needed for defining the category of measurement.

19. The system of claim 15, wherein the processor that is to select the CD marker candidate is controlled by at least one number that specifies an allowable region for a CD marker category and an expected value of the one or more CD marker candidates.

20. The system of claim 15, wherein the processor that is to select the CD marker candidate is at least further to specify a spatial region.

21. The system of claim 15, wherein the processor that is to select the CD marker candidate is at least further to use a randomly generated number and a decision process related to the randomly generated number.

22. The system of claim 15, wherein the processor that is to select the CD marker candidate is at least further to use information of a circuit that is realized by at least one layout pattern of the lithography image.

23. The system of claim 15, wherein the selected CD marker includes category information that determines CD measurement results.

24. The system of claim 23, wherein the processor that is to select the CD marker candidate or to generate the one or more CD marker candidates is at least further to use the CD measurement results.

25. The system of claim 15, wherein the processor that is to select the CD marker candidate or to generate the one or more CD marker candidates is at least further to use a gradient of pattern density that is defined by a ratio of difference of pattern area per unit area between neighborhood area.

26. The system of claim 15, in which the number comprises a randomly generated number.

27. The system of claim 15, wherein the processor is further programmed for storing a set of generated CD markers.

28. The system of claim 27, wherein the processor is further programmed for adding a newly generated CD marker to the set of generated CD markers.

29. A volatile or non-volatile computer readable medium storing a computer program comprising instructions which, when executed by a processing system, cause the system to perform a method for lithography simulation comprising:

specifying a position for measuring a difference between a lithography image and a target pattern;

generating one or more critical dimension (CD) marker candidates for a subject region by using a template having one or more CD markers; and selecting a CD marker candidate from the one or more CD marker candidates as a CD marker for the subject region, in which the selecting the CD marker candidate comprises combining a spatial region specification, a decision using a number, information of a circuit that is realized by a layout pattern of the lithography image, CD measurement results, and a gradient of pattern density.

30. The medium of claim 29, wherein generating one or more CD marker candidates includes generating a set of CD marker candidates.

31. The medium of claim 30, wherein selecting at least one CD marker from the one or more CD marker candidates includes selecting at least one CD marker from the set of CD marker candidates.

32. The medium of claim 29, wherein the act of generating the one or more CD marker candidates comprises using at least two pattern layers including a pattern layer to be measured by a category and another pattern layer needed for defining the category of measurement.

33. The medium of claim 29, wherein the act of selecting the CD marker candidate is controlled by at least one number that specifies an allowable region for a CD marker category and an expected value of the one or more CD marker candidates.

34. The medium of claim 29, wherein the act of selecting the CD marker candidate is achieved by specifying a spatial region.

35. The medium of claim 29, wherein the act of selecting the CD marker candidate is achieved by using a randomly generated number and a decision process related to the randomly generated number.

36. The medium of claim 29, wherein the act of selecting the CD marker candidate is achieved by using information of a circuit that is realized by at least one layout pattern of the lithography image.

37. The medium of claim 29, wherein the selected CD marker includes category information that determines CD measurement results.

38. The medium of claim 37, wherein selecting the at least one CD marker or generating the one or more CD marker candidates is achieved by using the CD measurement results.

39. The medium of claim 29, wherein the act of selecting the CD marker candidate or the act of generating the one or more CD marker candidates comprises using a gradient of pattern density that is defined by a ratio of difference of pattern area per unit area between neighborhood area.

40. The medium of claim 29, in which the number comprises a randomly generated number.

41. The medium of claim 29, further comprising storing a set of generated CD markers.

42. The medium of claim 41, further comprising adding a newly generated CD marker to the set of generated CD markers.

* * * * *